(12) United States Patent
Shinohara et al.

(10) Patent No.: US 7,126,968 B2
(45) Date of Patent: Oct. 24, 2006

(54) DATA COMPRESSION SYSTEM, DATA DECOMPRESSION SYSTEM, SUPERVISORY CONTROL SYSTEM AND COMPUTER-READABLE STORAGE MEDIUM

(75) Inventors: Wataro Shinohara, Kawasaki (JP); Yasuo Takagi, Chigasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 1245 days.

(21) Appl. No.: 09/731,827

(22) Filed: Dec. 8, 2000

(65) Prior Publication Data

US 2001/0003527 A1    Jun. 14, 2001

(30) Foreign Application Priority Data

Dec. 9, 1999    (JP)    ............................... P.11-350388

(51) Int. Cl.
*H04J 3/00* (2006.01)
(52) U.S. Cl. ..................................... 370/521; 375/240
(58) Field of Classification Search ................ 370/521, 370/477; 375/240, 240.18, 240.19, 240.01, 375/240.03, 240.1, 240.2, 2
See application file for complete search history.

(56) References Cited

U.S. PATENT DOCUMENTS

| | | | |
|---|---|---|---|
| 5,138,673 A | | 8/1992 | Yoshida et al. |
| 5,497,435 A | * | 3/1996 | Berger .......................... 382/249 |
| 5,600,373 A | * | 2/1997 | Chui et al. ................ 375/240.1 |
| 5,684,693 A | * | 11/1997 | Li ................................... 702/6 |
| 5,802,369 A | | 9/1998 | Ganesh et al. |
| 5,905,814 A | * | 5/1999 | Mochizuki et al. .......... 382/239 |
| 6,128,413 A | * | 10/2000 | Benamara .................... 382/251 |
| 6,301,578 B1 | * | 10/2001 | Harris ......................... 707/101 |
| 6,327,540 B1 | * | 12/2001 | Miyano et al. ................ 702/57 |
| 6,373,986 B1 | * | 4/2002 | Fink ............................ 382/232 |
| 6,404,930 B1 | * | 6/2002 | Inuzuka et al. ............. 382/235 |
| 6,594,394 B1 | * | 7/2003 | Stromberg et al. .......... 382/232 |
| 6,609,085 B1 | * | 8/2003 | Uemura et al. ............. 702/189 |
| 6,792,150 B1 | * | 9/2004 | Satoh .......................... 382/238 |
| 6,795,581 B1 | * | 9/2004 | Nomura ...................... 382/232 |

FOREIGN PATENT DOCUMENTS

| | | |
|---|---|---|
| JP | 6-274193 | 9/1994 |
| JP | 11-316765 | 11/1999 |

* cited by examiner

*Primary Examiner*—Ricky Q. Ngo
*Assistant Examiner*—Andrew C. Lee
(74) *Attorney, Agent, or Firm*—Oblon, Spivak, McClelland, Maier & Neustadt, P.C.

(57) ABSTRACT

In a data compression system for compressing an original time series data with a various waveform, a compression unit compresses the original time series data without damaging characteristics of waveform information in the various waveform. The waveform information includes a signal with a various change, especially, a sudden change of signal. An encoding unit encodes the compressed time series data so as to generate a compression code.

20 Claims, 25 Drawing Sheets

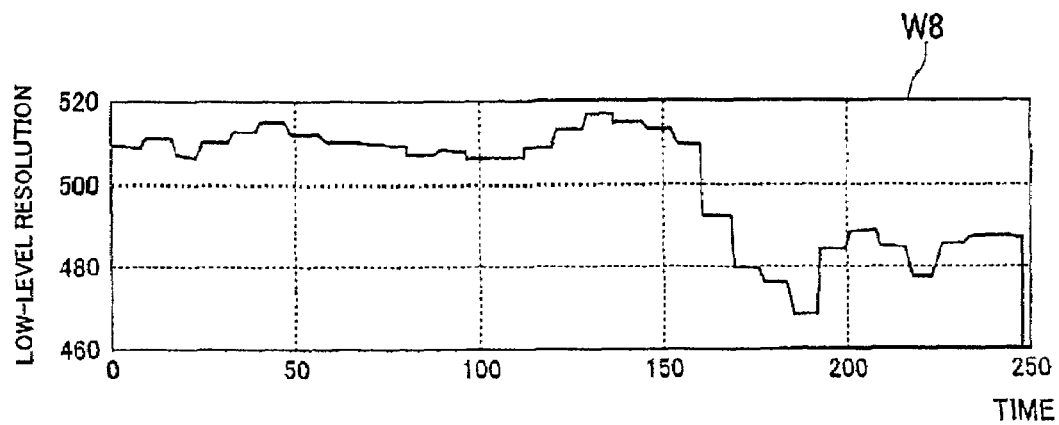
F I G. 24A
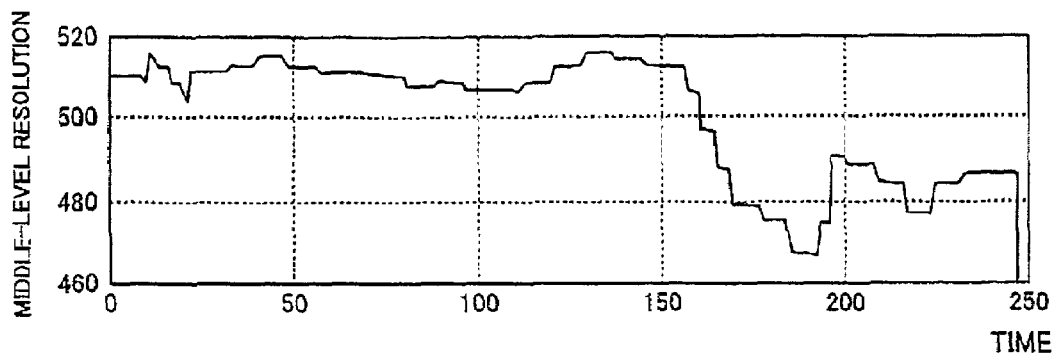
F I G. 24B
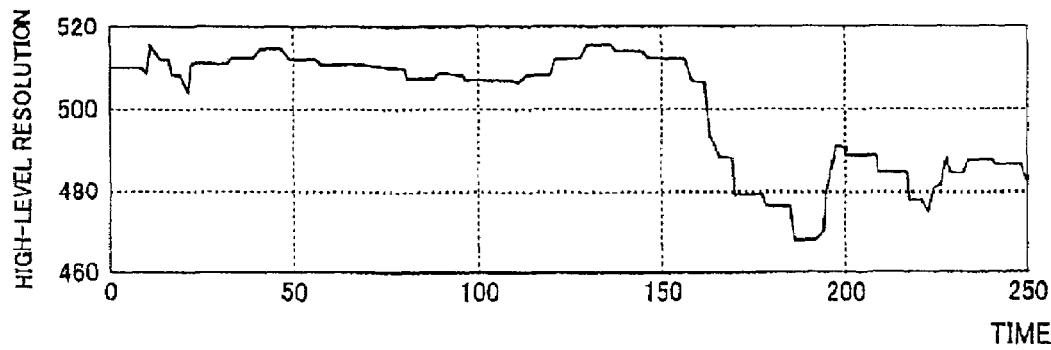
F I G. 24C

DATA COMPRESSION SYSTEM, DATA DECOMPRESSION SYSTEM, SUPERVISORY CONTROL SYSTEM AND COMPUTER-READABLE STORAGE MEDIUM

BACKGROUND OF THE INVENTION

1. Field of the Invention

The present invention relates to a data compression system that is operative to compress time series data to produce a compression data (compression code), a data decompression system that is operative to expand (decompress) a compression data to produce an original data and a supervisory control system that has a function for remotely supervising and controlling an object unit.

The present invention also relates to a computer-readable storage medium capable of storing thereon a program code that causes a computer to execute a data compression process and a computer-readable storage medium capable of storing thereon a program code that causes a computer to execute a data decompression (expansion) process.

2. Description of the Prior Art

Generally, in cases where an object unit such as, a device, a system or the like, which requires maintenance services such as adjustment, supervision or maintenance is arranged remotely from a center (service center), it is proposed to provide a remote maintenance system capable of communicating various time series data through a network between the object unit and the center.

In the conventional remote maintenance system, time series data gained by the object unit are compressed to be communicated to the remote side (the center which is remotely arranged to the object unit).

As a conventional data compression system for compressing the time series data of the object unit to produce compressed data thereby transmitting the compressed data to the remote side of the center, there is well known the data compression system which is disclosed in Japanese Patent Application Laid-Open Publication No. 8-65768.

According to the disclosed data compression system, the time series data are compressed by performing polygonal approximation by using the peak positions of the pseudo two-stage differential values of the time series data so that the compressed data are transmitted to the remote side center, whereby the event retrieving is performed from the characteristics of the polygonal approximation data of the transmitted compressed data.

Furthermore, there is also well known the data compression system which is disclosed in Japanese Patent Application Laid-open Publication No. 11-122604.

According to the disclosed data compression system, the measured time series data of the mechanical system as the object unit are processed by the fast Fourier transform (FFT) so that data only including the peak frequency, and the amplitude and phase information thereof are transmitted to the remote side center, so that the transmitted compressed data are decompressed on the remote side center in the form in which the state of the vibration of the measured time series data can easily visually understood.

However, in each of the conventional data compression systems, from the viewpoint of the degree of decompression of original data when decompressing the compressed data, it is hard to ensure a sufficient accuracy of the decompression.

That is, according to the conventional data compression system disclosed in Japanese Patent Application Laid-Open Publication No. 8-65768, there is the possibility that the peak determining accuracy by the pseudo two-stage differential information necessary for the polygonal approximation is considerably damaged by the complexity of the behavior of the time series data or the inclusion of noise therein.

In addition, in the case where the time series data has oscillating response characteristics, there is the high possibility that the compression processing to the time series data damages the characteristic thereof, such as "oscillating", or the like, and therefore, it is difficult to accurately supervisory and control the object unit and to provide a service based on a high-level judgment to the object unit with a practical communication load.

Furthermore, according to the conventional data compression system disclosed in Japanese Patent Application Laid-Open Publication No. 11-122604, because the waveform information on non-stationary behavior thereof, that is, on the time base, which is also the characteristic of the time series data, is lost in the FFT compressed data, it is difficult to accurately supervise and control the object unit.

SUMMARY OF THE INVENTION

The present invention is directed to overcome the foregoing problems.

Accordingly, it is a first object of the present invention to provide a data compression system capable of compressing time series data of an object unit without damaging (losing) the characteristic thereof, such as the "oscillating" thereof or the waveform information on the non-stationary behavior thereof.

In addition, it is a second object of the present invention to provide a data decompression system capable of decompressing a compressed data, which is produced by compressing time series data of an object unit without damaging the characteristic thereof, wherein the decompressed data keeps the characteristic of the time series data.

Moreover, it is a third object of the present invention to provide a supervisory control system for an object unit, which is remotely arranged thereto and has the data compression system and the data decompression system according to the present invention, and which is capable of compressing time series data of the object unit without damaging (losing) the characteristic thereof by the data compression system, and of decompressing the compressed data so that the decompressed data keeps the characteristic of the time series data, whereby it is possible to accurately supervise and control the object unit, thus performing analysis and judgment processing for making a higher-level judgment on the operating state of the object unit on the remote side supervisory control system, making it possible to provide various remote services for the object unit.

Furthermore, it is a fourth object of the present invention to provide a computer-readable storage medium capable of storing thereon a program code that causes a computer to compress time series data of an object unit without damaging the characteristic thereof, such as the "oscillating" thereof or the waveform information on the non-stationary behavior thereof.

Still furthermore, it is a fifth object of the present invention to provide a computer-readable storage medium capable of storing thereon a program code that causes a computer to decompress a compressed data, which is produced by compressing time series data of an object unit without damaging the characteristic thereof, wherein the decompressed data keeps the characteristic of the time series data.

In order to achieve such objects, according to one aspect of the present invention, there is provided a data compression system for compressing an original time series data with a various waveform, comprising a compression unit that compresses the original time series data without damaging characteristics of a waveform information in the various waveform, the waveform information including a signal with a various change; and an encoding unit that encodes the compressed time series data to generate a compression code.

In preferred embodiment of this one aspect, the signal with the various change includes one of a step-like signal change and a local signal average value, and the compression unit compresses the original time series data without damaging a waveform information on non-stationary behavior thereof.

According to this one aspect of the present invention, it is possible to compress the original data without damaging characteristics of waveform information in the various waveform including a signal with a various waveform, such as, a sudden change of signal including at least one of a step-like signal change and a local signal average value.

In preferred embodiment of this one aspect, the compression unit performs a wavelet transform to the original time series data by using a transform coefficients to decompose the original time series data into a predetermined level numbers of component waveforms, each of the component waveforms of each level having local peak value data; and extracts at least one of the local peak value data of each of the component waveforms, the extracted local peak value data having an absolute value which is not less than a predetermined threshold value, and the encoding unit encodes the extracted local peak value data of each of the component waveforms of each of the levels on the basis of information used for the decomposition of the compression unit to generate the compression code.

According to the preferred embodiment of this one aspect of the present invention, by executing the compression process by using the wavelet transform, it is possible to make intensive the wavelet information of the sudden change of signal in the original data to each local peal value of each component waveform in each level of each transform coefficient, thereby generating a compression code by using the local peak value data of each component waveform and the information used for the decomposition of the compression unit.

In order to achieve such objects, according to another aspect of the present invention, there is provided a supervisory control system for a supervisory control of an object unit according to an original time series data thereof, the original time series data with a various waveform, the system comprising: a compression unit that compresses the original time series data without damaging characteristics of a waveform information in the various waveform, the waveform information including a signal with a various change; an encoding unit that encodes the compressed time series data so as to generate a compression code, thereby transmitting the compression code through a communication network; and a decompression unit that is intercommunicated through the communication network with the encoding unit and receives the transmitted compression code so as to decompress the received compression code, thereby reconstructing the characteristics of waveform information of the original time series data.

In order to achieve such objects, according to further aspect of the present invention, there is provided a data decompression system, comprising: a receiving unit that receives a compression code, the compression code being obtained by compressing an original time series data without damaging characteristics of waveform information in a various waveform thereof, the waveform information including a signal with a various change; and a decompression unit that decompresses the received compression code, thereby reconstructing the characteristics of the waveform information of the original time series data.

In order to achieve such objects, according to still further aspect of the present invention, there is provided a computer-readable storage medium comprising: means for causing a computer to compress an original time series data with a various waveform without damaging characteristics of waveform information in the various waveform, the waveform information including a signal with a various change; and means for causing a computer to encode the compressed time series data so as to generate a compression code.

In order to achieve such objects, according to still further aspect of the present invention, there is provided a computer-readable storage medium comprising: means for causing a computer to receive a compression code, the compression code being obtained by compressing an original time series data without damaging characteristics of waveform information in a various waveform, the waveform information including a signal with a various change; and means for causing a computer to decompress the received compression code, thereby reconstructing the characteristics of the waveform information of the original time series data.

In order to achieve such objects, according to still further aspect of the present invention, there is provided a method of compressing an original time series data with a various waveform, comprising the steps of: compressing the original time series data without damaging characteristics of a waveform information in the signal waveform, the waveform information including a signal with a various change; and encoding the compressed time series data to generate a compression code.

In preferred embodiment of this still further aspect, the signal with the various change includes one of a step-like signal change and a local signal average value, and wherein the compressing step compresses the original time series data without damaging a waveform information on non-stationary behavior thereof.

According to the above aspects of the present invention, by utilizing a compression transmission technique, it is possible to remotely supervise and control, through a communication network, the measured time series data from an object unit on site with a practical communication load, that it is hard to use through the communication network, so that it is possible to realize, through a present communication network such as a public network, an ISDN or the like, to judge the operational state of the object unit based on the high signal processing with the use of the supervised time series data, to supervise the control performance of the object unit and to remotely monitor the state thereof.

BRIEF DESCRIPTION OF THE DRAWINGS

Other objects and aspects of the present invention will become apparent from the following description of embodiments with reference to the accompanying drawings in which:

FIG. 24A is a view showing a time series data with a low-level resolution corresponding to the lowest frequency according to the eighth embodiment of the present invention;

FIG. 24B is a view showing a time series data with a modest-level resolution in the high frequency direction from the time series data shown in FIG. 24A according to the eighth embodiment;

FIG. 24C is a view showing a time series data with a maximum-level resolution in the highest frequency direction from the time series data shown in FIG. 24B according to the eighth embodiment;

DETAILED DESCRIPTION OF THE PREFERRED EMBODIMENTS

Figure 1:
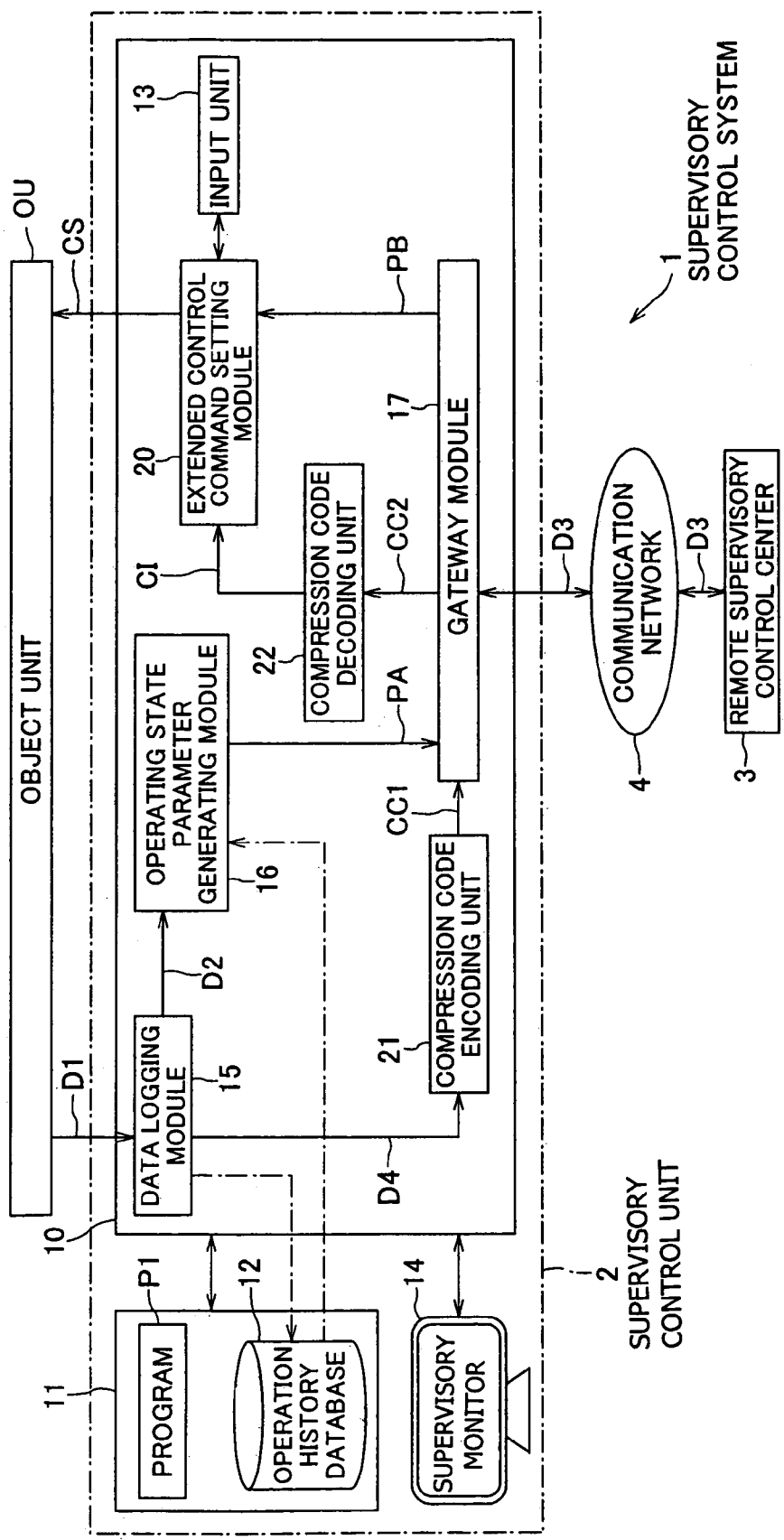
FIG. 1 is a functional block diagram of a supervisory control system according to a first embodiment of the present invention.
Figure 2:
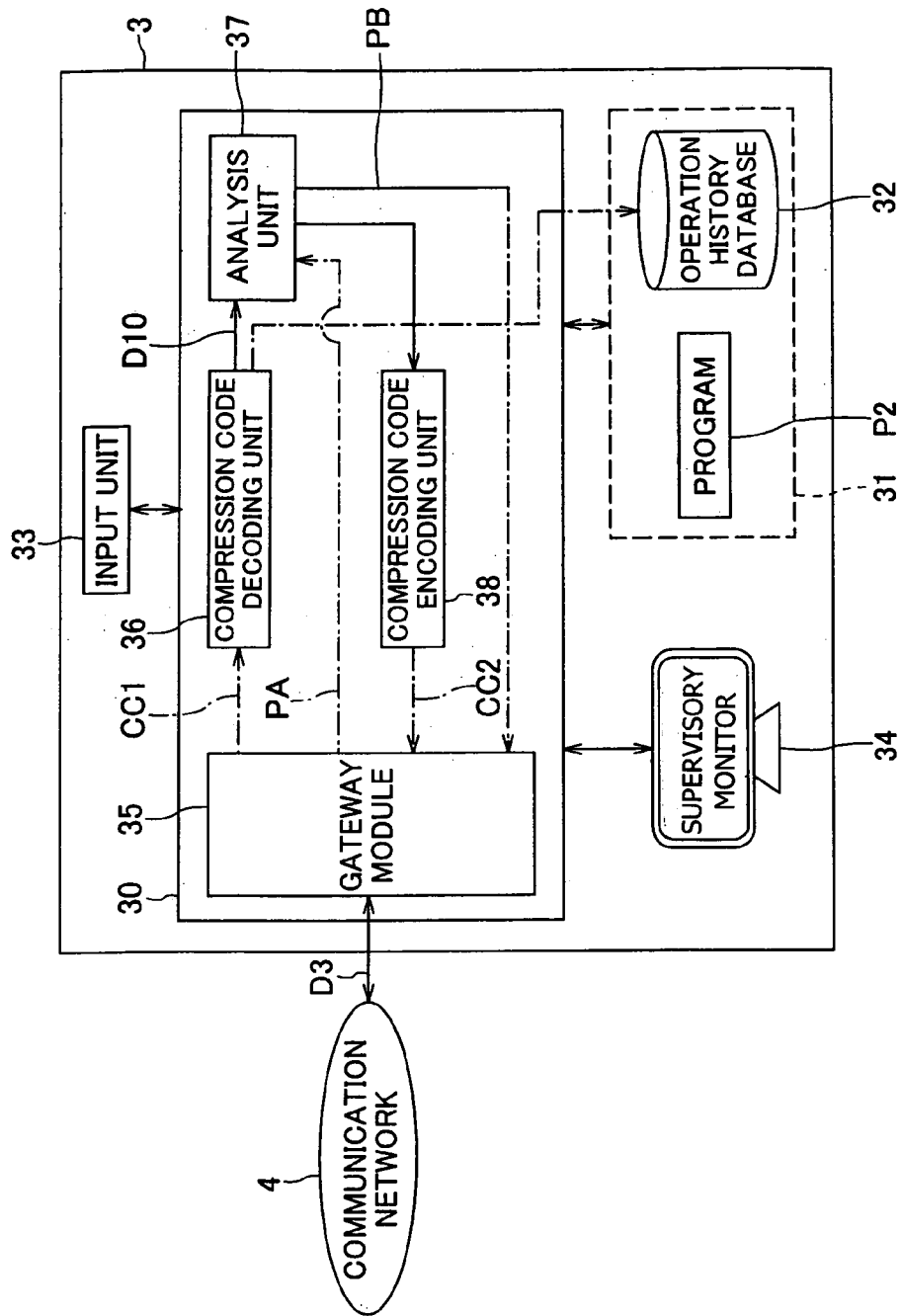
FIG. 2 is a functional block diagram of a remotely supervisory control center in FIG. 1 according to the first embodiment of the present invention.

The embodiments of the present invention will be described hereinafter according to FIGS. 1 to 27. It is noted that same or equivalent elements are denoted by the same reference numerals throughout the drawings and that repetition descriptions of the elements are omitted.

(First Embodiment)

FIG. 1 is a functional block diagram of a supervisory control system according to a first embodiment of the present invention.

In FIG. 1, the supervisory control system 1 comprises a supervisory control unit 2 provided for a site on which an object unit OU, such as, an equipment, a device or the like and adapted to supervisory control the object unit OU.

The supervisory control system 1 also comprises a remote supervisory control center 3 which is remotely provided with respect to the supervisory control unit 2 and is interconnected through a communication network 4 such as a wire/wireless communication network, which includes, for example, at least one of a public line, a private line, ISDN (Integrated Service Digital Network), an xDSL (x Digital Subscriber Line) and so on to the control unit 2 so that data communication is permitted between the control unit 2 and the control center 3 therethrough.

The control unit 2 comprises at least one computer system.

That is, the control unit (computer system) 2 comprises a computer 10 for performing operations related to the supervisory control of the object unit OU, a memory 11 storing thereon a program P which is readable by the computer 10 and an operation history database 12.

The control unit 2 also comprises an input unit 13 which permits an operator, by operating the input unit 13, to input a command to the computer 10, and a supervisory monitor 14 for displaying thereon the supervisory information of the object unit OU.

The computer 10 has a plurality of functions (functional modules) which is executed by the computer 10 on the basis of the stored program P1.

That is, the computer 10 has a data logging module 15 for collecting (cutting out) measurement data (original time series data having a data frame with a predetermined data length) D1 of the object unit OU for each data group at predetermined time intervals, respectively, so as to store the cut-out measurement data on the operation history database 12 as digital data with a finite word length Moreover, the data logging module 15 of the computer 10 displays the measurement data of a given time section on the supervisory monitor 14 as it is for each suitable data group, so that the displayed measurement data is utilized on the site as supervisory information showing the behavior of the variables of the main process of the object unit OU.

In addition, the computer 10 has an operating state parameter generating module 16 for retrieving a part of the stored measurement data D1 from the operation history database 12 as measurement data so as to generate various kinds of operating state parameters PA including, for example, simple statistics such as average values of the variables of the main process of the object unit OU, dispersion thereof or the like for information-intensively showing the operating state of the object unit OU. The operating state parameter generating module 16 provides the generated operating state parameters PA, as onsite supervisory information, for the supervisory monitor 14 so as to be displayed thereon.

The computer 10 also has a gateway module 17 for interfacing through the communication network 4 so as to permit data communication between terminals connected to the communication network 4.

Furthermore, the computer 10 has an extended control command setting module 20 for setting a suitable control command corresponding to the present state of the object unit OU.

Still furthermore, the computer 10 comprises a compression code encoding unit 21 for inputting original time series data in the measurement data so as to perform compression processing while utilizing the characteristic amount of the signal change of the time series data thereby outputting a compression code CC1, and a compression code decoding unit 22 for inputting a time series compression code of control information CC2 transmitted from the remote supervisory control center 3 so as to decode (decompress, reconstruct) the transmitted time series compression code of control information CC2 thereby outputting a time series control information CI.

The gateway module 17 is operative to transmit the operating state parameters PA and the compression code CC1 through the communication network 4 to the remote supervisory control center 3 as transmission data D3, and to receive the time series compression code of control information CC2 transmitted through the communication network 4 as the transmission data to provide it for the compression code decoding unit 22.

On the other hand, the remote supervisory control center 3 comprises at least one computer system. That is, the remote control center (computer system) 3 comprises a computer 30 for performing operations related to the supervisory control of the object unit OU, a memory 31 storing thereon a program P2 which is readable by the computer 30 and an operation history database 32.

The remote supervisory control center 3 comprises an input unit 33 which allows a supervisor, by operating the input unit 33, to input a command to the computer 30, and a supervisory monitor 34 for displaying thereon the supervisory information of the object unit OU.

The computer 30 has a plurality of functions (functional modules) which is executed by the computer 30 on the basis of the stored program P2.

That is, the computer 30 has a gateway module 35 which is similar function of the gateway module 17 of the control unit 2 for receiving through the communication network 4 the transmission data D3 corresponding to the operating state parameters PA and the compression code CC1, and a compression code decoding unit 36 which is similar function for the compression code decoding unit 22 for decompressing the compression code CC1 to decode time series data, and an analysis unit 37 for analyzing the operating state parameters PA to remotely supervise the operating state of the object unit OU, whereby, according to the supervised result, if needed, to transmit control parameters PB to the gateway module 35.

The analysis unit 37 is also operative to analyze and evaluate the decoded time series data so as to decide the control command with respect to the object unit OU on the basis of the results of the analysis and the evaluation.

The computer 30 also has a compression code encoding unit 38 for inputting the control command decided by the analysis unit 37 so as to perform compression processing thereby outputting the time series compression code of the control information CC2 to the gateway module 35.

The gateway module 35 of the computer 30 is adapted to receive the control parameters PB and the time series compression code of the control information CC2 so as to combine them, thereby transmitting the combined data PB and CC2 as the transmission data D3.

Next, the total operation of the supervisory control system 1 of the present embodiment will be described.

According to the supervisory control system 1 of this first embodiment, in the control unit side (site side), the compression code encoding unit 21 is adapted to compress the original time series data with a various waveform without damaging the characteristics of the waveform information in the various waveform. The waveform information includes a signal with a various change, for example, a sudden change of signal including a step-like signal change and/or a bias change (local signal average value change), and/or a locally signal average value change, and/or harmonic/high frequency component and/or temporary emergence of harmonic/high frequency component and the like without losing the waveform information on the time base of the original time series data, that is, without damaging the waveform information on non-stationary behavior thereof.

The compression code encoding unit 21 is adapted to transmit the compression-encoded time series data (compression code CC1) to the remote supervisory control center 3 through the gateway module 17 and the communication network 4.

In addition, in the remote supervisory control center side (remote side), the compression code decoding unit 36 is adapted to decompress (reconstruct) the transmitted compression code CC1 so as to decode the time series data including the characteristics of the original time series data.

That is, in the supervisory control system 1, the original time series data in the measurement data D2 collected from the object unit OU for remotely to be used for the remote supervision and analysis are taken in by the data logging module 15 of the supervisory control unit 2, so that the taken time series data are transmitted through the operation history database 3 to the compression code encoding unit 21 as measurement data of compression transmission D4. In the compression code encoding unit 21, the transmitted measurement data of compression code D4 are compressed while utilizing the characteristic amount of the signal change so as to produce the compression code CC1 and after that, the produced compression code CC1 is outputted by the compression code encoding unit 21 to the gateway module 17.

On the other hand, the measurement data D2 are inputted by the data logging module 15 in the operating state parameter generating module 16 from the operation history database 3, so that, by the operating state parameter generating module 16, the operating state parameters PA are generated to be outputted to the gateway module 17.

Then, by the gateway module 17, the compression code CC1 and the operating state parameters PA are transmitted to the remote supervisory control center 3 through the communication network 4 as the transmission data D3.

Next, in the remote supervisory control center 3, the transmission data D3 is received by the gateway module 35 so that the compression code CC1 in the transmission data D3 is decompressed by the compression code decompression unit 36 so as to produce the reconstruction time series data D10.

Figure 3A:
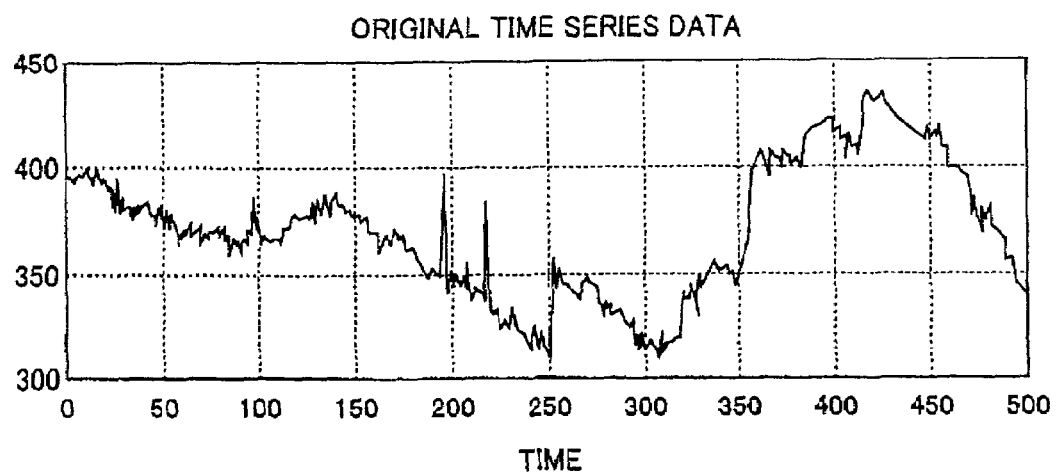
FIG. 3A is a view showing an example of original time series data according to the first embodiment of the present invention.
Figure 3B:
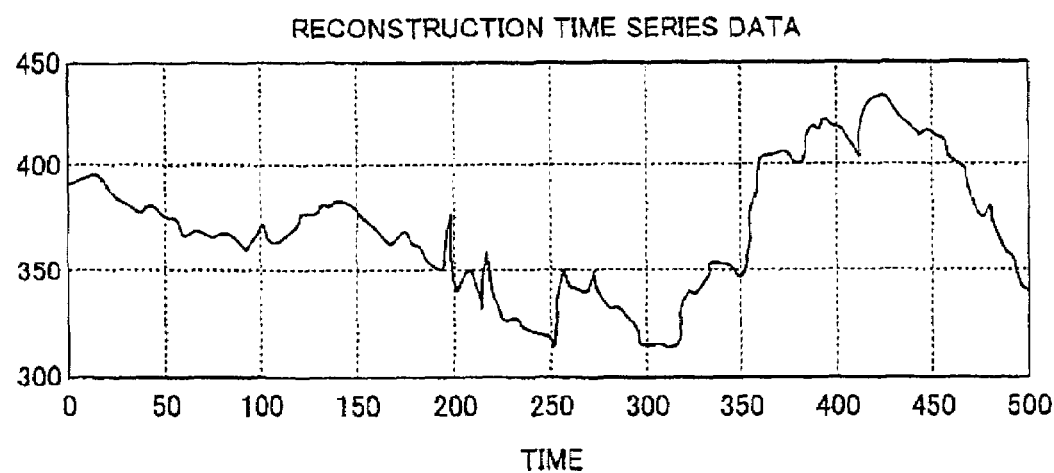
FIG. 3B is a view showing an example of the reconstruction data produced by decompressing the compression data of the original time series data in FIG. 3A according to the first embodiment of the present invention.

Then, FIG. 3A is a view showing the original time series data D1 according to the first embodiment, and FIG. 3B is a view showing the reconstruction data D10 produced by decompressing the compression data CC1 of the original time series data D1 in FIG. 3A according to the first embodiment.

That is, as shown in FIG. 3A, the original time series data D1 including dynamics information is coded while maintaining a high compression ratio and sufficiently keeping the characteristics of the signal change thereof as shown in FIG. 3B.

Then, the reconstruction time series data D10 are analyzed and evaluated by the analysis unit 37 to decide the control command with respect to the object unit OU on the basis of the results of the analysis and the evaluation, so that the control command, if necessary, is inputted in the compression code encoding unit 21. That is, in the case where the control command is not inputted, the compression encoding unit 21 can be operative.

The inputted control command is compressed so as to be outputted as the time series compression code of the control information CC2 to the gateway module 35.

On the other hand, the operating state parameters PA in the transmission data D3 is analyzed by the analysis unit 37 to display the analyzed result based on the operating state parameters PA on the supervisory monitor 34 so as to remotely supervise the operating state of the object unit OU, thereby, according to the supervised result, if needed, transmitting the control parameters PB to the gateway module 35.

The control parameters PB and the time series compression code of the control information CC2 are combined with each other so that the combined data PB and CC2 are transmitted as the transmission data D3 through the communication network 4 to the control unit 2.

In the control unit 2, the transmission data D3 is received by the gateway module 17 so as to be separated into the control parameters PB and the time series compression code of the control information CC2, and the time series compression code of the control information CC2 is decompressed so as to take out the time series control information CI. The separated control parameters PB and the time series control information CI are transmitted to the extended control command setting module 20.

In the expansion control command setting module 20, according to the transmitted time series control information CI and the control parameters PB, and, in a case where the control command inputted by the input unit 13 from the operator, the inputted control command, a control setting command CS including for example control conditions (such as a control limit value and so on) and a control target set value and the like with respect to the object unit OU is finally determined so as to be outputted thereto.

As mentioned above, according to the first embodiment, it is possible to realize the transmission and reception function of the time series data (information) in addition to the conventional information-intensive type of the transmission data, because of providing the compression code encoding unit 21 and the compression code decoding unit 22.

That is, according to the supervisory control system 1 of the first embodiment, because the original time series data including dynamics information is coded while maintaining a high compression ratio and sufficiently keeping the characteristics of the signal change thereof and the waveform information on the time base thereof, as shown in FIGS. 3A and 3B, at a place apart from the production site on which the object unit OU is provided, it is possible to remotely provide various types of services such as the quasi-real time comparison between the detailed simulation and the onsite data, the control performance evaluation, the operation optimization, the estimation performance evaluation, the high-level supervisory control, and the dynamic maintenance support in an overseas plant, whose providing through a network has been difficult because of the data accuracy until now.

(Second Embodiment)

Figure 4:
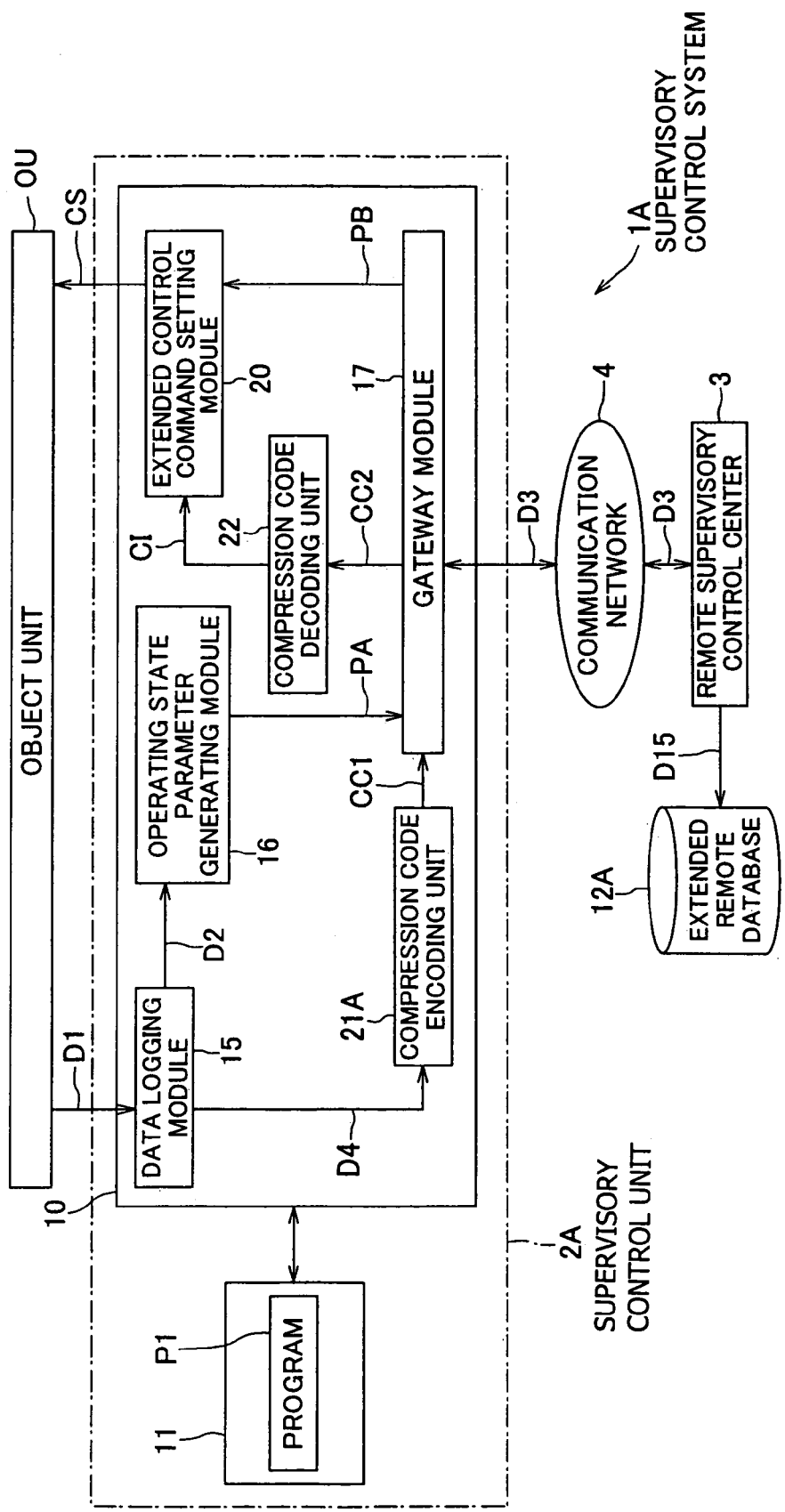
FIG. 4 is a functional block diagram of a supervisory control system according to a second embodiment of the present invention.

FIG. 4 is a functional block diagram of a supervisory control system according to a second embodiment of the present invention.

The supervisory control system 1A shown in FIG. 4 is applied to the remote supervision of an elevator or the like whose job site requires unmanned supervision in principle.

Figure 11:
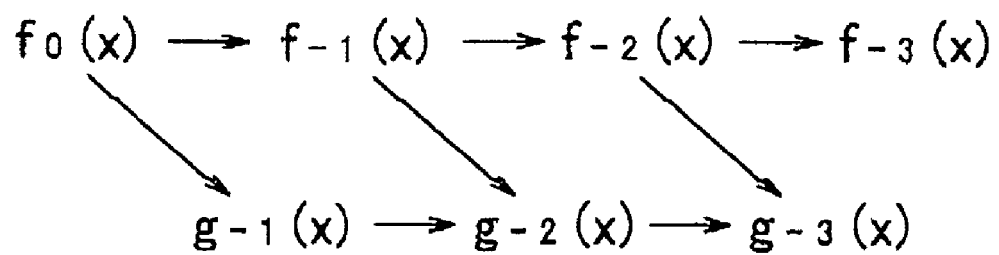
FIG. 11 shows a view showing a relation ship between the respective time series component waveforms shown in FIGS. 10A~10E.

In FIG. 4, differently from FIG. 11 the operation history database 12 is arranged on the remote supervisory control center 3 side as an extended remote database 12A, and the function of the supervisory monitor 14 and the input unit 13 are also removed from the control unit 2A.

The supervisory control unit 2A shown in FIG. 4 is mounted for example, in an elevator machine control room or the like as one to several sheets of board computers. In this case, as data to be transmitted to the remote supervisory control center 3 side, in addition to the information-intensive type integrated values, which are useful for the remote supervision of the number of working times or the number of poor operating times in door opening and closing or the like, the time series data are transmitted thereto.

That is, in FIG. 4, the extended remote database 12A is provided on the remote supervisory control center 3 side, and the extended remote database 12A is adapted to store thereon at least one of the compression code CC1, the operating state parameters PA, the reconstruction time series data D10 and the control command CM. In addition, the compression code encoding unit 21A is adapted to directly receive the measurement data of compression transmission D4 from the data logging module 15.

Other elements of the supervisory control system 1A according to the second embodiment are substantially equal to those of the supervisory control system 1 shown in FIG. 1 of the first embodiment, and therefore, the descriptions thereof are omitted.

In this second embodiment, the same effects of the supervisory control system 1 in the first embodiment are obtained.

Figure 5:
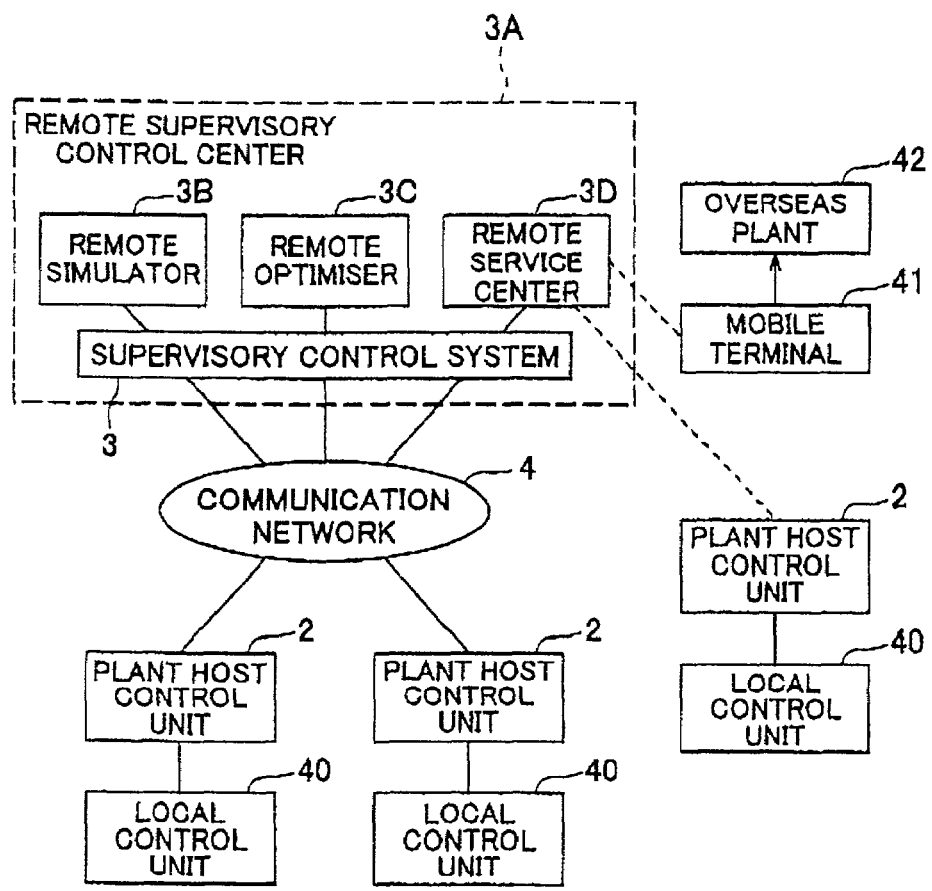
FIG. 5 is a functional block diagram showing a configuration of a remote service to which at least one of the supervisory control systems of the first and second embodiments of the present invention is applied.

FIG. 5 is a functional block diagram showing a configuration of a remote service to which at least one of the supervisory control systems of the first and second embodiments is applied.

In one example shown in FIG. 5, for a customer A, a plant host control unit including the same functions of the supervisory control unit 2 has a local control unit 40 for locally controlling a plant corresponding to the object unit OU, and the plant host control unit 2 is connected to the communication network 4. For customer B, a plant host control unit including the same functions of the supervisory control unit 2 has a local control unit 40 for locally controlling a plant corresponding to the object unit OU is connected to the communication network. Furthermore, to the communication network 4, the remote supervisory control center 3A having a supervisory control system 3 corresponding to the computer system of the supervisory control center 3 is connected, and to the remote supervisory control center 3A, a remote simulator 3B, a remote optimizer 3B and a remote service center 3C are provided, and they are connected through the supervisory control system 3 to the communication network 4, respectively.

That is, the remote simulator 3B is adapted to remotely simulate the operating state of the object unit (plant) by using the reconstruction time series data, the remote optimizer 3C is adapted to remotely optimize the operation of the plant by using the reconstruction time series data and the remote service center 3D is adapted to remotely provide services for the plant by using the reconstruction time series data.

Furthermore, the remote service center 3D of the remote supervisory control center 3A is connected through a communication line such as a telephone line, an ISDN or the like to a plant host control unit including the same functions of the supervisory control unit 2 for customer C. The plant host control unit has a local control unit 40 for locally controlling a plant corresponding to the object unit OU.

On the other hand, the remote service Center 3D is connected to a mobile terminal 41 for site maintenance personnel for maintaining and inspecting an overseas plant 42 with a communication line such as a telephone line or an ISDN.

In the application of the supervisory control system according to the first or second embodiment, the same effects of the supervisory control system 1 in the first embodiment are obtained.

(Third Embodiment)

Figure 6:
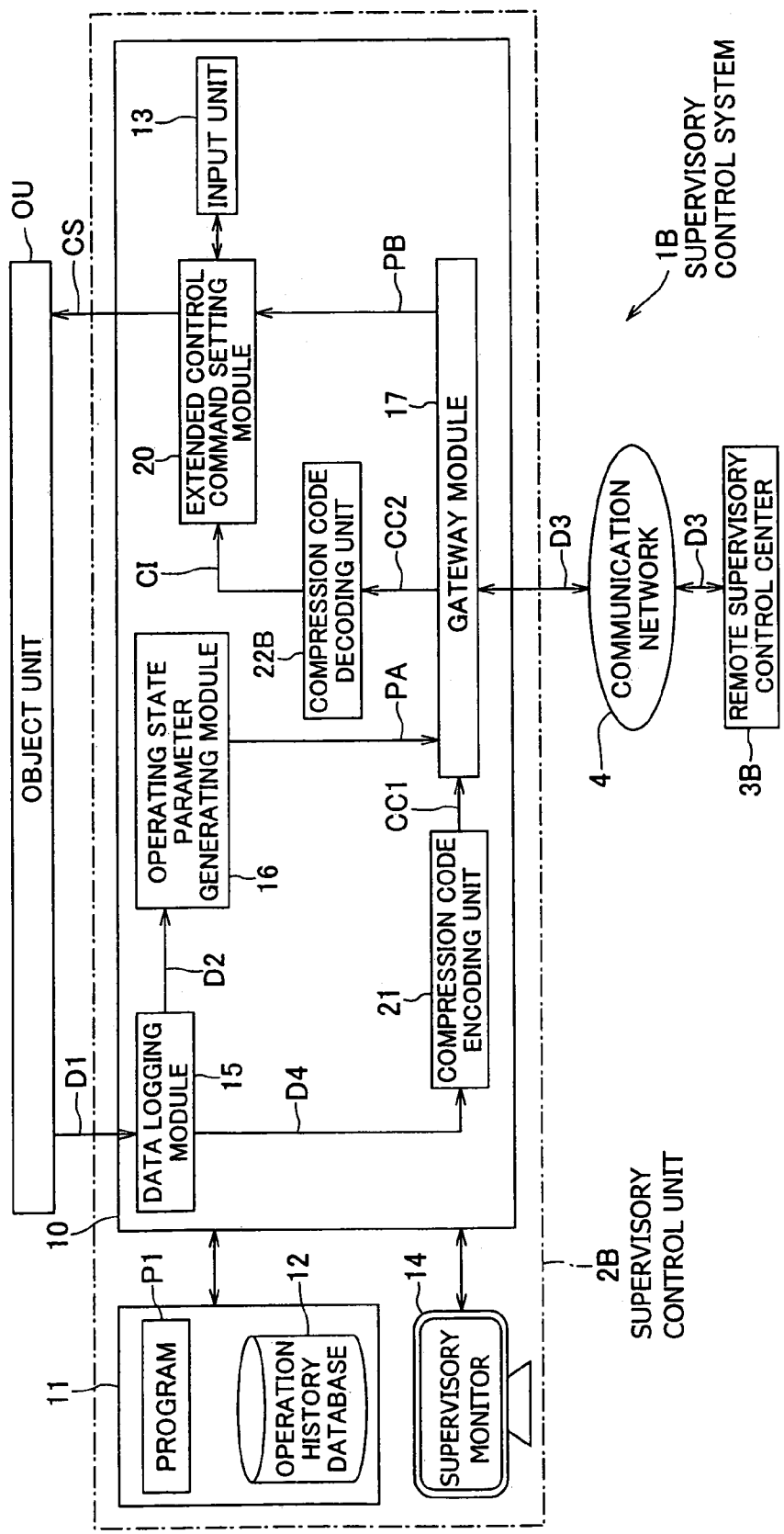
FIG. 6 is a functional block diagram of a supervisory control system according to a third embodiment of the present invention.
Figure 7:
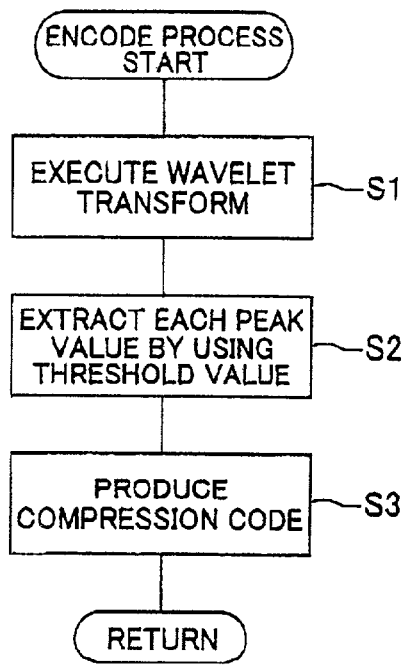
FIG. 7 is a flow chart schematically showing processes of a compression code encoding unit of the supervisory control system according to the third embodiment.
Figure 8:
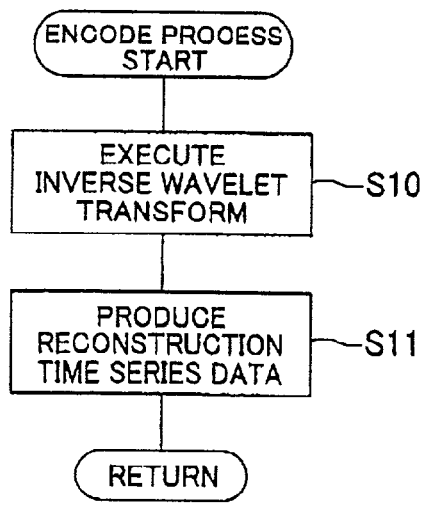
FIG. 8 is a flow chart schematically showing processes of a compression code decoding unit of the supervisory control system according to the third embodiment.

FIG. 6 is a functional block diagram of a supervisory control system according to a third embodiment of the present invention.

In the supervisory control system 1B according to the third embodiment, the compression code encoding unit 21B, the compression code decoding unit 22B, the compression code encoding unit 38B and the compression decoding unit 36B are different from those of the supervisory control system 1 of the first embodiment.

That is, the third embodiment of the present invention gives attention to the fact that the waveform information relating to, for example, the step-like signal change or the sudden change of the local signal average value is summarized to the local peak value in each decomposition level thereof in the wavelet transform, and attains the compression and encoding of the time series data by extracting each peak value information including each peak position information thereof, each peak value or the like.

That is, the compression code encoding unit 21B executes the wavelet transform by using the time series data (Step S1), extracts each peak value information of each decomposition level of each transform coefficient by using a given threshold value (Step S2) and produces the compression codes on the basis of each peak value information and information used in the process of the wavelet transform (Step S3).

In addition, the compression code decoding unit 36B of the remote supervisory control center 3B executes an inverse wavelet transform of the compression code compressed by using the wavelet transform (Step S10) and produces the reconstruction time series data on the basis of the result of the inverse wavelet transform (Step S11).

Here, the wavelet transform in Step S1 of the compression code encoding unit 21B will be described.

The wavelet transform is described in detail in various books and documents. For example, it is described in detail in "Mathematical Science Seminar Wavelet Beginner's Guide" by Susumu Sakakibara, Tokyo Denki University Press, 1995, and therefore, the details will be omitted and only the wavelet transform relating to the present invention will be described.

First, the general formula of the wavelet transform is defined like the following formula (1).

$$(W_\psi f)(b, a) = \int_{-\infty}^{\infty} \frac{1}{\sqrt{|a|}} \overline{\psi\left(\frac{x-b}{a}\right)} f(x)\, dx \tag{1}$$

where, $(W_\psi f)$ (b,a) : value of wave transform f (x) : function $\psi\{(x-b)/a)\}$ function made by replacing variable of x of mother wavelet $\psi$ (x) of function f (x) by $\{(x-b)/a\}$ Furthermore, the above-described formula (1) can be inverted to the next formula (2).

$$f(x) = \frac{1}{c_\psi} \int \int_{R^2} (W_\psi f)(b, a) \frac{1}{\sqrt{|a|}} \psi\left(\frac{x-b}{a}\right) \frac{dadb}{a^2} \quad (2)$$

where, in order to define the right part, it is necessary to fulfill the admissible condition of the next formula (3).

$$c_\psi = \int_{-\infty}^{\infty} \frac{|\hat{\psi}(\omega)|^2}{|\omega|} d\omega < \infty \quad (3)$$

where, $\hat{\psi}$ is Fourier transform of $\psi$.

On the other hand, in the discrete wavelet transform used in the present invention for the efficient time-frequency analysis of the signal, the above-described formula (1) is defined like the next formula (4). Furthermore, the inverse transform of the formula (2) is shown by the next formula (5).

$$d_k^{(j)} = 2^j \int_{-\infty}^{\infty} \overline{\psi(2^j x - k)} f(x) dx \quad (4)$$

$$f(x) \sim \Sigma\Sigma d_k^{(j)} \psi(2^j x - k) \quad (5)$$

where, $d^{(j)}_k$: discrete wavelet transform value (coefficient value)
f(x): function
$\psi(2^j x-k)$: mother wavelet function of function f (x)
j: integer
k: integer FIGS. 9A~9F show examples of time-frequency analysis results of the discrete wavelet transform according to the third embodiment.

In FIGS. 9A~9F, the signal component of each level in the case where j in the above-described formula (4) is decreased one by one (j=0, −1, −2, −3, −4, −5) is shown vertically in the direction of (A) to (F) of the time-frequency distribution waveform W3, and the low frequency direction is made by going from the top to the bottom in FIG. 9.

That is, FIG. 9 shows each of the next time series signal component waveforms obtained by j and k of the above-described formula (4).

Figure 9A:
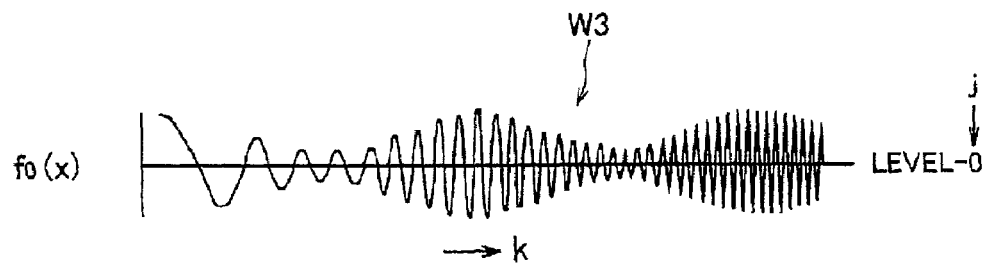
FIGS. 9A~9F show examples of time-frequency analysis results of a discrete wavelet transform according to the third embodiment.
Figure 9B:
Figure 9C:
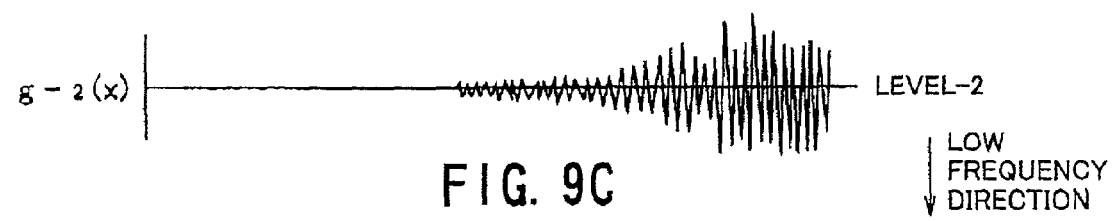
Figure 9D:
Figure 9E:
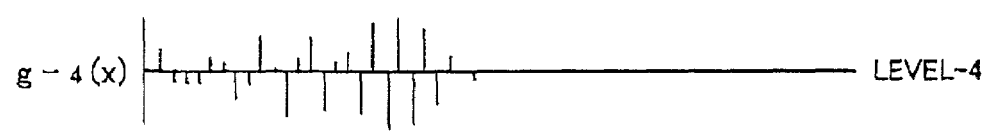
Figure 9F:
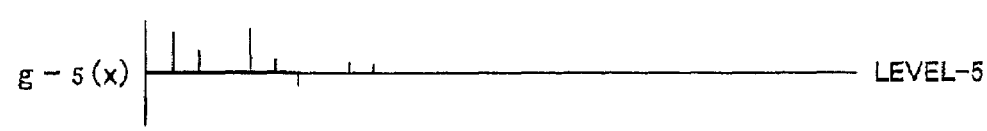

FIG. 9A is a time series signal component waveform in the case where j=0 and time information is k, FIG. 9B is a signal component waveform in the case where j=−0 and time information is k, FIG. 9C is a signal component waveform in the case where j=−2 and time information is k, FIG. 9D is a signal component waveform in the case where j=−3 and time information is k, FIG. 9E is a signal component waveform in the case where j=−4 and time information is k, and FIG. 9F is a signal component waveform in the case where j=−5 and time information is k.

FIG. 10 shows an example where the original time series data are wavelet-transformed to each level signal component of a high frequency to a low frequency, according to the third embodiment of the present invention.

Figure 10A:
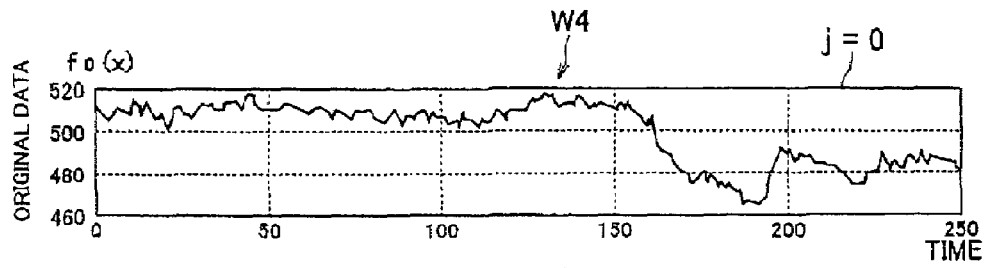
FIG. 10A shows the original time series data of j=0.
Figure 10B:
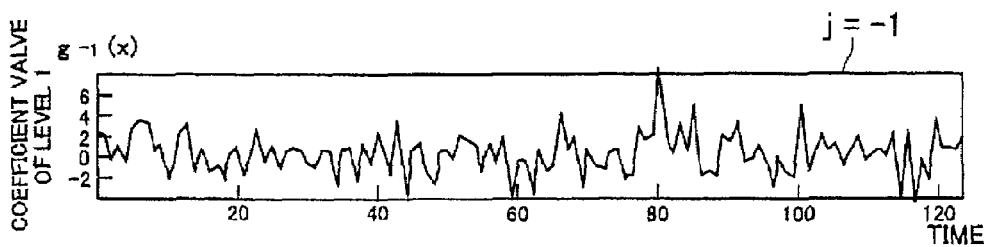
FIG. 10B shows a time series component waveform corresponding to the coefficient value of level 1 of j=−1.
Figure 10C:
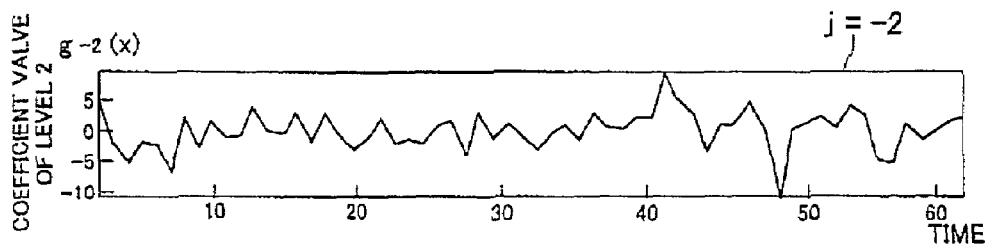
FIG. 10C shows a time series component waveform corresponding to the coefficient value of level 2 of j=−2.
Figure 10D:
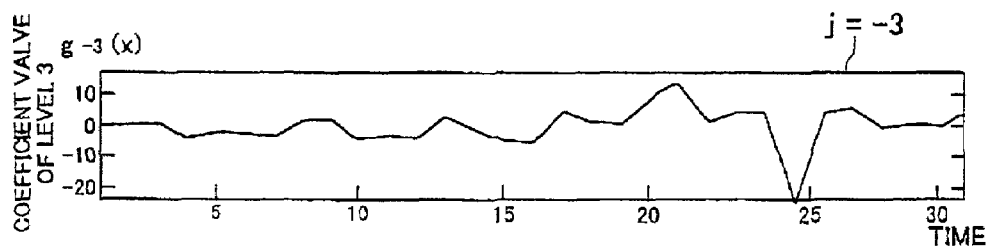
FIGS. 10D shows a time series component waveform corresponding to the coefficient value of level 3 of j=−3.
Figure 10E:
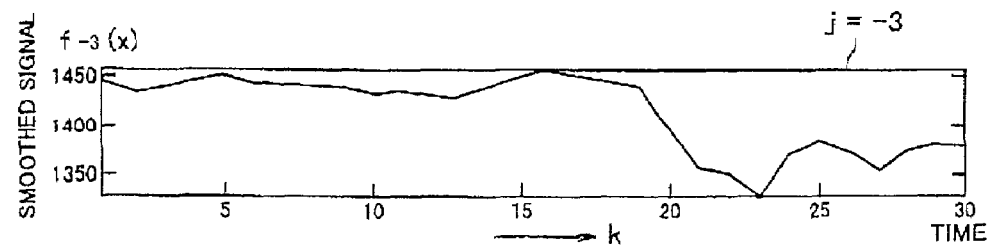
FIG. 10E shows a waveform of the component of the smoothed signal of j=−3.

Incidentally, FIG. 10E shows a waveform of the component of the smoothed signal of j=−3, as for lower-frequency components, only f-3(x) is shown.

Here, the integers j and k correspond to the above-described formula (4) and formula (5).

Furthermore, the signal component waveforms W4 shown in

FIGS. 10A~10E have the relation shown in FIG. 11, which is shown by the next formula (6).

$$f_j(x) = g_{j-1}(x) + f_{j-1}(x) \quad (6)$$

Thus, the original data (the original data-frame; such as the original time series data with a predetermined data frame) cut out from continually sampled time series data for the compression encoding shown in FIG. 10A is wavelet-transformed by a suitable mother wavelet function, and it is decomposed into the data component of the coefficient value of level 1 of j=−1 corresponding to the time shown in FIG. 10B, the data component of the coefficient value of level 2 of j=−2 shown in FIG. 10C, the data component of the coefficient value of level 3 of j=−3 shown in FIG. 10D, and the smoothed signal of j=−3 shown in FIG. 10E.

FIG. 10E shows the finally obtained smoothed signal excluding the high frequency component, as for lower-frequency components, only f-3(x) is shown.

It is a result of the internal signal processing that the number of data in the horizontal axis (time base) direction in FIG. 10 is decreased.

Next, the extraction processing in Step S2 of the compression code encoding unit 21B will be described.

That is, each peak is selected by using a given threshold value (for example, 5 in here) among each signal component waveform W4 shown in FIG. 10. By this processing in Step S2, the effective information (coefficient having a value other than 0) is largely decreased like the time series signal component waveforms W5 shown in FIG. 12.

Figure 12A:
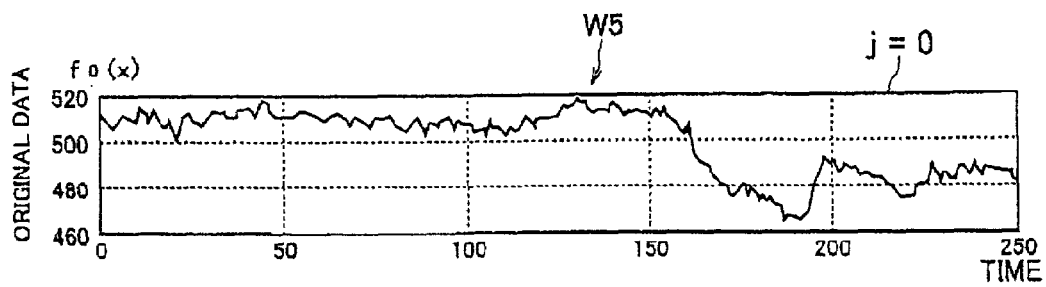
FIG. 12A is a view showing the original time series data according to the third embodiment.
Figure 12B:
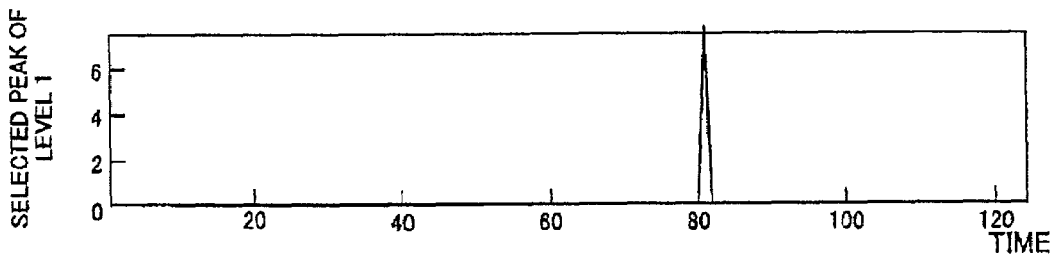
FIGS. 12B~FIG. 12D show respective peak values of the respective levels.
Figure 12C:
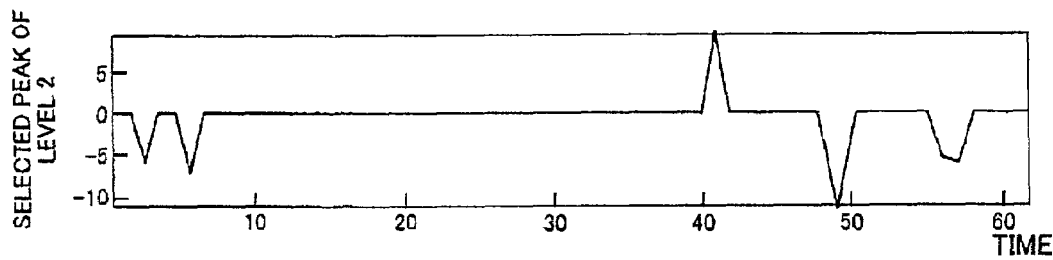
Figure 12D:
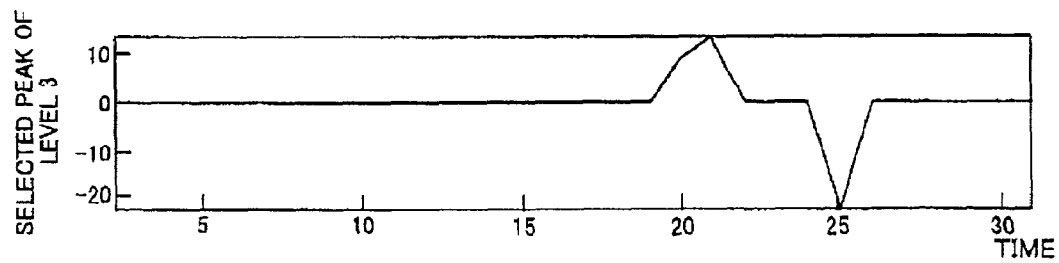
Figure 12E:
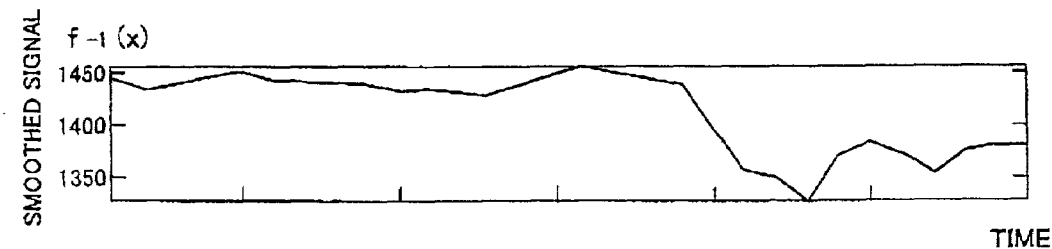
FIG. 12E shows the same smoothed signal component as shown in FIG. 10E.

That is,

FIG. 12A is a view showing the original time series data, FIG. 12B shows a selected peak of the coefficient value of level 1, FIG. 12C shows a selected peak of the coefficient value of level 2, FIG. 12D shows a selected peak of the coefficient value of level 3, and FIG. 12E shows the same smoothed signal component as shown in FIG. 10E.

Next, the production processing of the compression code in step S3 of the compression code encoding unit 21B will be described.

Figure 13:
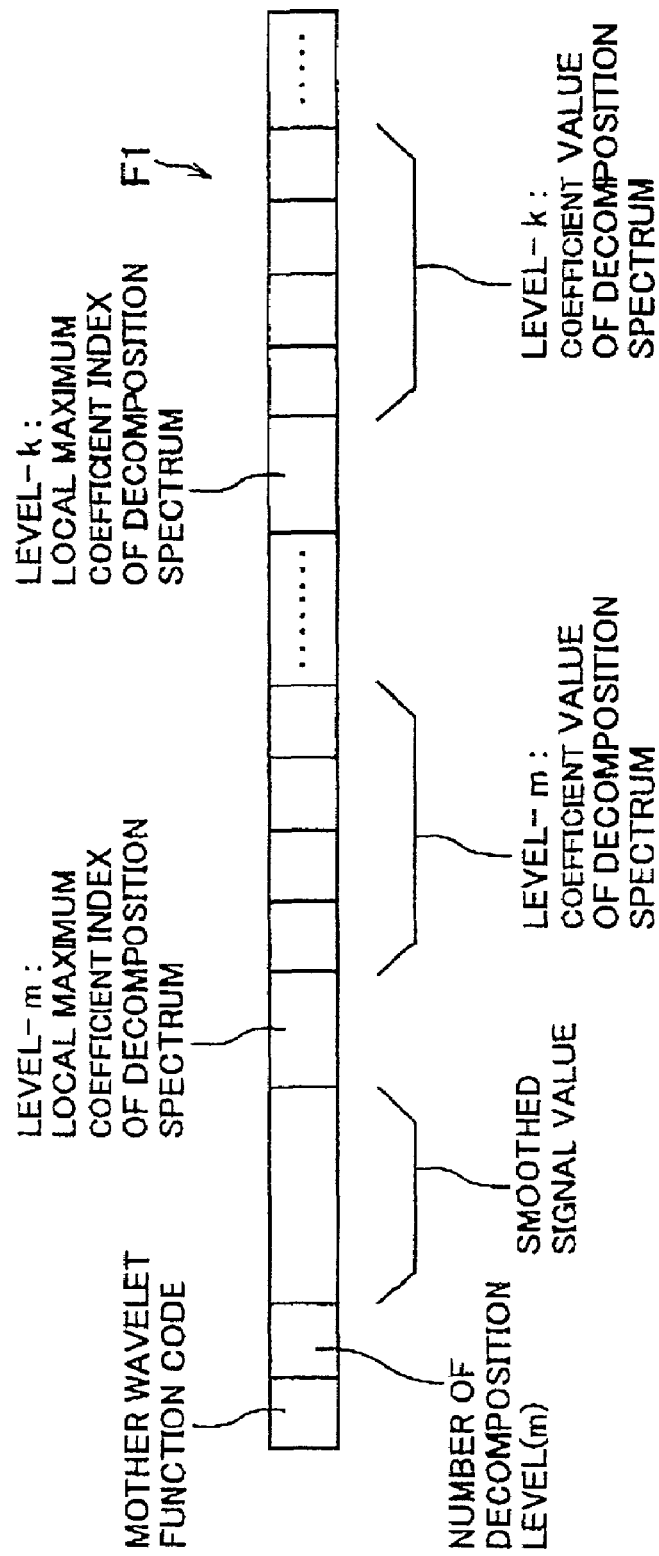
FIG. 13 is a view showing one example of a compression format of a compression code according to the third embodiment of the present invention.

FIG. 13 is a view showing one example of a data format of the compression code produced by Step S3 of the compression code encoding unit 21B according to the third embodiment.

This compression code format F1 of the compression code includes the information on the mother wavelet function code used for the transform and the number of the decomposition level (m), the smoothed signal value vector, and each peak information selected at each level in the case where the normal wavelet transform is used for the compression.

That is, in FIG. 13, each peak information of each level is made of each local maximum coefficient index (integer value vector; number of selected peaks in each level may be added for the compression code) and each coefficient value of the decomposition spectrums of level-m to level-l.

Figure 14A:
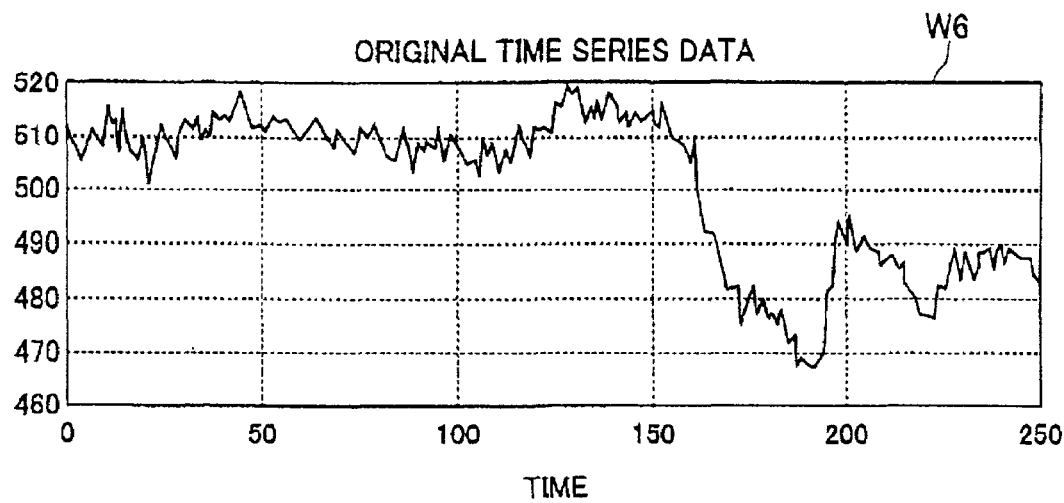
FIG. 14A is a view showing an example of original time series data according to the third embodiment of the present invention.
Figure 14B:
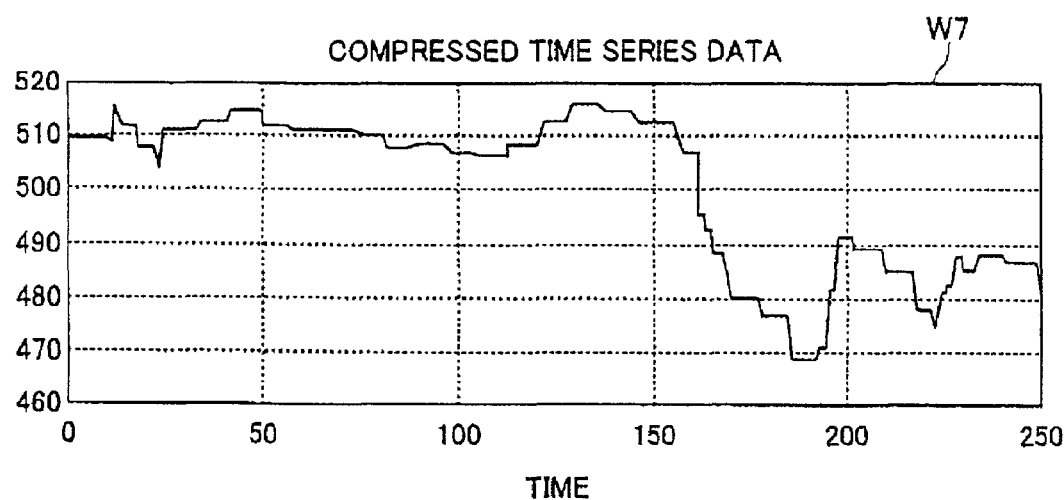
FIG. 14B is a view showing an example of the decompressed data produced by decompressing the compressed data of the original time series data in FIG. 14A according to the third embodiment of the present invention.

FIG. 14A is a view showing an example of original time series data W6 according to the third embodiment of the present invention, and FIG. 14B is a view showing an example of the decompressed data (reconstruction data) W7 produced by decompressing the compression data of the original time series data in FIG. 14A according to the third embodiment.

Thus, it is possible to realize a compression ratio of about one tenth to one twentieth by the above-described compression processing, which depends on the characteristics of the compression object data, and it is possible to perform the compression Without damaging the dynamics Information and the waveform information on the time base included in the original time series data, and up to the degree where the network transmission becomes possible with a sufficiently practical communication load.

Next, a modification of the third embodiment will be described.

The modification of the third embodiment gives attention to the fact that the lowest frequency component (smoothing function) after performing the decomposition or a given level can be converged to the average value of the original time series data (signal) by skillfully selecting the wavelet function used for the decomposition in the sub band decomposition of the signal, and improves the compression ratio of the data by using the wavelet transform, in the compression using the wavelet transform described in the second embodiment.

Figure 15:
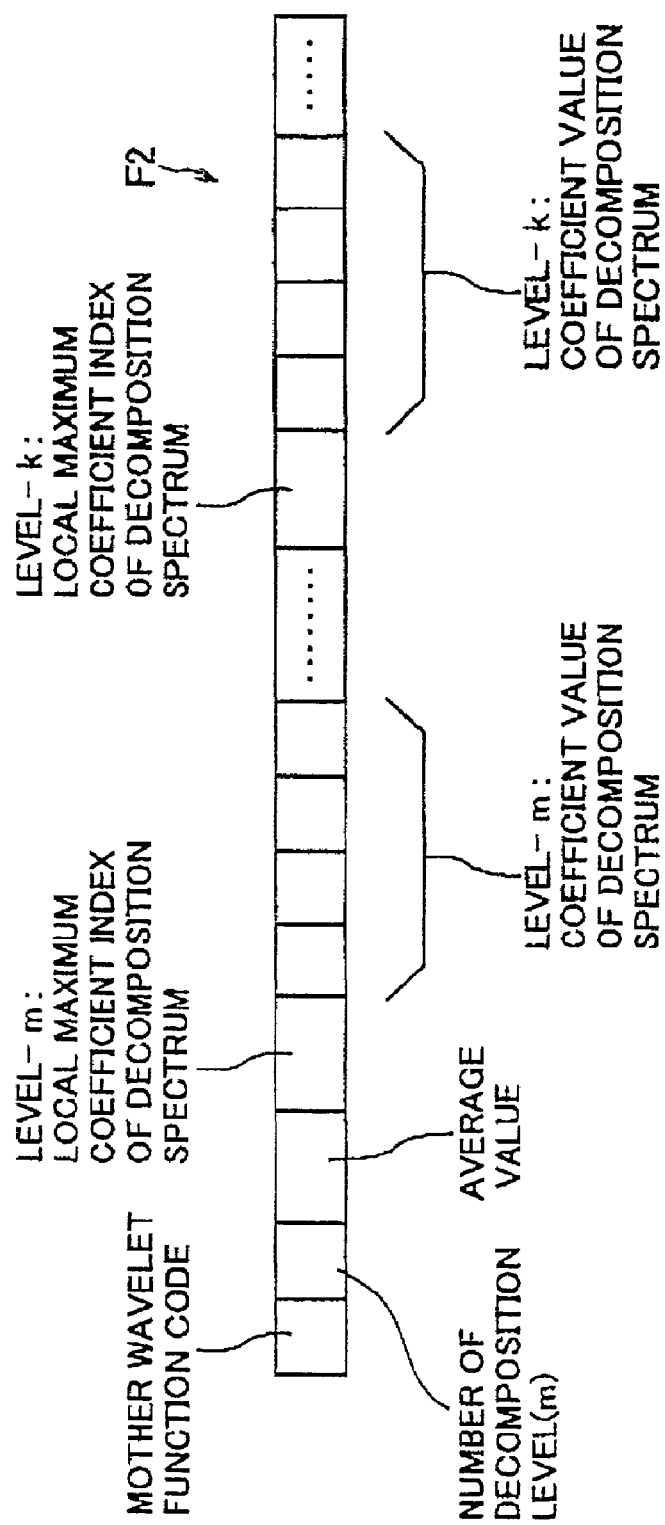
FIG. 15 is a view showing another example of a compression format of a compression code according to a modification of the third embodiment of the present invention.

FIG. 15 is a view showing another example of a compression code format according to the modification of the third embodiment of the present invention.

This compression code format F2 is a modification of the compression code format shown in FIG. 13, and the smoothed signal value can be converged to the average value of the original signal by suitably selecting the wavelet function used for the transform, when the number of decomposition levels is a given number or more. Accordingly, in such a case, as shown in FIG. 15, the smoothed signal value vector shown in FIG. 11 can simply be replaced by a scalar amount that is a signal average value.

Herein, as for the compression code generated as described above, on the decompression side, the compression code is decomposed, and the inverse wavelet transform is performed, and the reconstructed time series data is generated.

(Fourth Embodiment)

The fourth embodiment of the present invention will be described by referring to FIG. 16 and FIG. 17.

Figure 16:
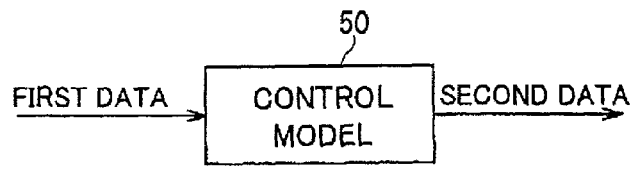
FIG. 16 is a view showing a control model and a relation between a first data and a second data through the control model according to a supervisory control system of a fourth embodiment of the present invention.

FIG. 16 is a view showing a control model and a relation between a first data and a second data through the control model according to a supervisory control system of the fourth embodiment.

In the case where, in the control model 50 on the compression side (the control unit side), another variable in the object unit OU for explaining the behavior of a specific variable therein is clear so that the input and output relation between the first data on the input side, which corresponds one of the variables, and the second data on the output side, which corresponds other thereof is precise, in the fourth embodiment, when compressing the first and second time series data which have this input and output relation with each other, the compression code encoding unit 21C compresses only the first data (the first time series data) on the basis of the compression process described in the third embodiment and the modification thereof so as to produce the compression code.

The compression code encoding unit 21C also combines the produced compression code with the model parameter of the control model 50 which is obtained by time-series-modeling the transfer characteristics between the first time series data and the second time series data, so as to transmit the combined code to the remote supervisory control center 3, thereby being received to be decompressed by the compression code decoding unit 36C.

Figure 17A:
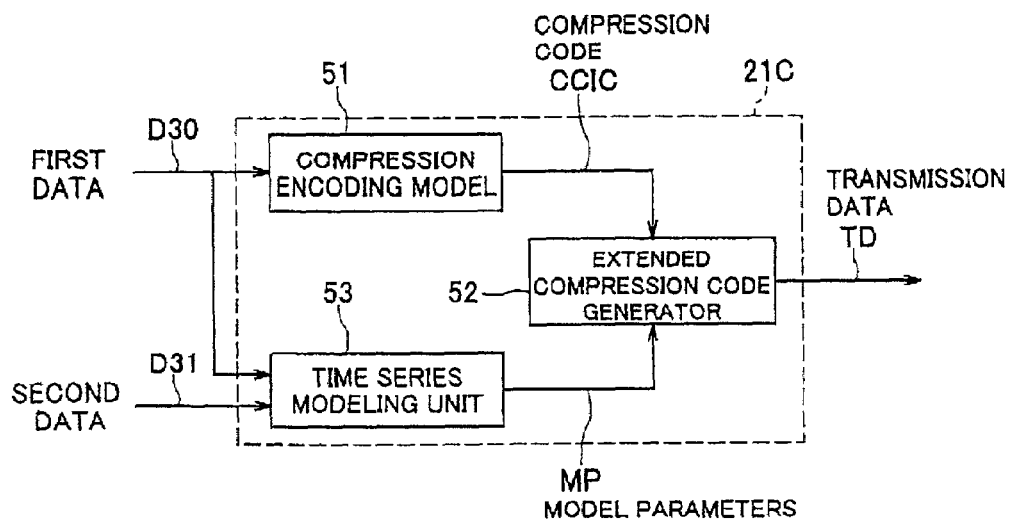
FIG. 17A is a block diagram schematically showing functions of a compression code encoding unit of the supervisory control system according to the fourth embodiment.
Figure 17B:
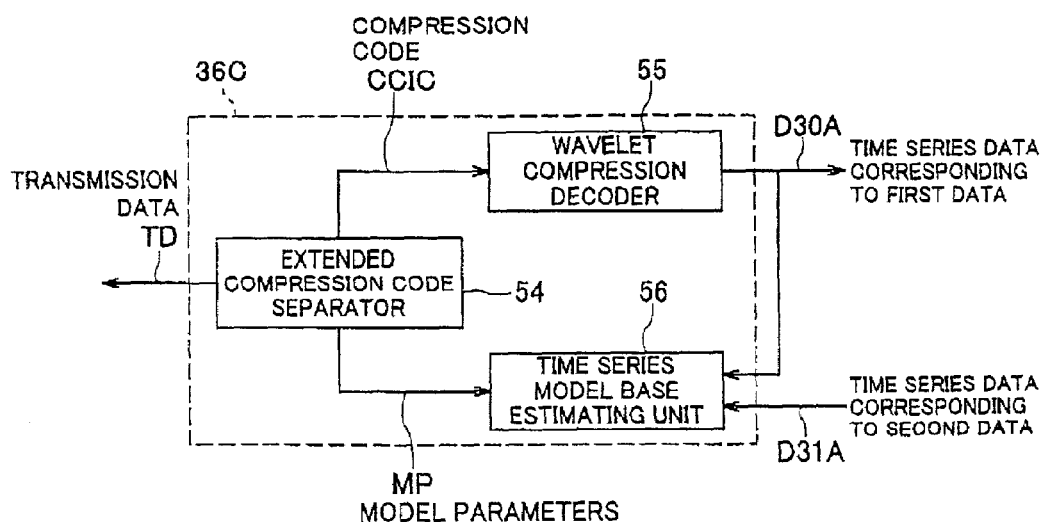
FIG. 17B is a block diagram schematically showing functions of a compression code decoding unit of the supervisory control system according to the fourth embodiment.

FIG. 17A is a block diagram schematically showing functions of the compression code encoding unit 21C, and FIG. 17B is a block diagram schematically showing functions of the compression code decoding unit 36C.

As shown in FIG. 16, it is supposed that first time series data (first data) and the second time series data (second data) to be remotely utilized have the input and output relation of the suitable dynamics with each other.

That is, in the fourth embodiment, as shown in FIG. 16, it is supposed that in the control model 50, the first data and the second are specified by the transfer function between the input data (first data) and the output data (second data), and both of these first data and second data are compressed and transmitted, and further, they are decompressed.

First, on the compression side, that is, in the compression code encoding unit 21C, the first data D30 is encoded by the previously described wavelet compression encoding module 51 corresponding to one of the compression code encoding unite 21A and 21B so that the compression code CC1C is outputted to the extended compression code generator 52.

On the other hand, the second data D31 is inputted into the time series modeling unit 53, and in the time series modeling unit 53, model parameters MP are determined by identifying the time series model (the transfer function of the control model 50) between the input and output, that is, the first and second data D30 and D31, so that the model parameters MP are outputted to the extended compression code generator 52.

Then, on the basis of the previously generated compression code CC1C of the first data D30 and the model parameters MP, the transmission data TD generated by combining the first data D30 and the model parameters MP is generated to be transmitted to the communication network 4 as the extended compression code.

The transmitted extended compression code TD is received through the gateway module 35 to be transmitted to the compression code decoding unit 36C.

Figure 18:
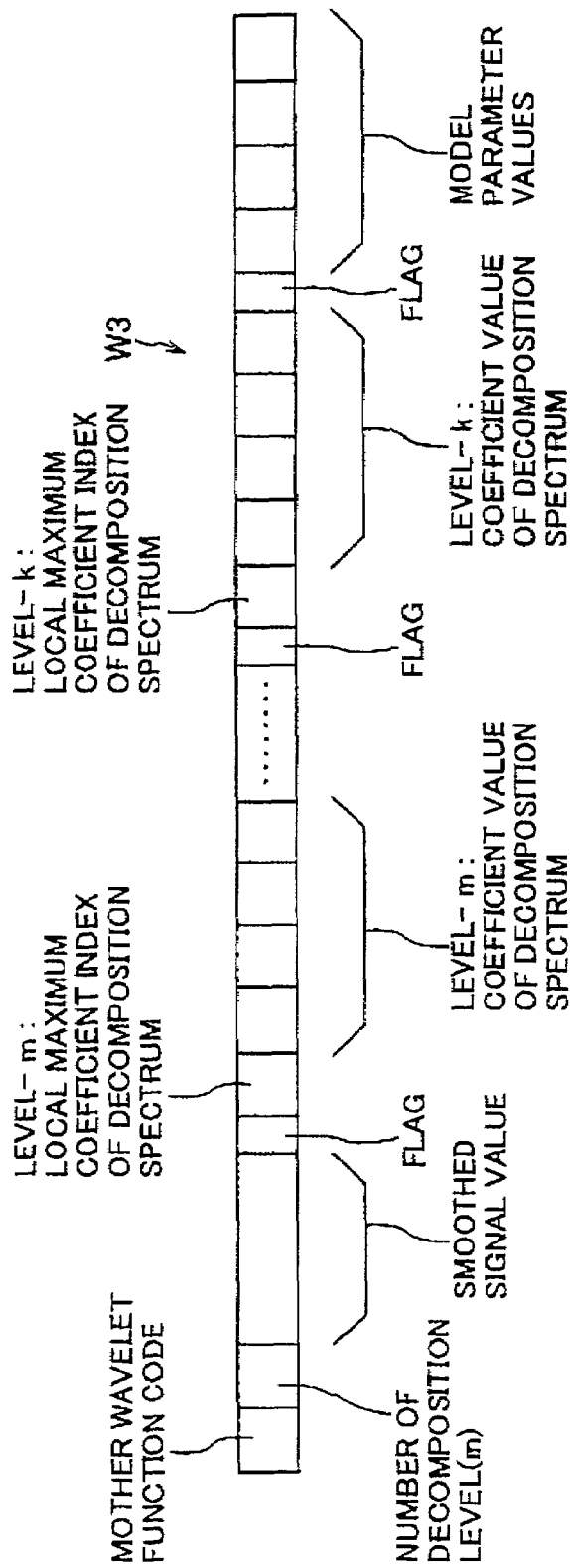
FIG. 18 is a view showing a compression format of a compression code according to the fourth embodiment of the present invention.

FIG. 18 is a view showing one example of a compression code format of the extended compression code TD produced by the compression code encoding unit 21C.

This compression code format F3 includes, in addition to the mother wavelet function code, the number of the decomposition level (m), the smoothed signal value vector, each local maximum coefficient index (integer value vector) and each coefficient value of the decomposition spectrums of level-m to level-k, model parameter values, one flag data assigned each local maximum coefficient index for permitting the extended compression code separator 54 to identify each local maximum coefficient index and each coefficient value, and other flag data assigned the model parameter values for permitting it to identify the model parameters.

On the decompression side, that is, in the compression code decoding unit 36C, the received extended compression code TD is inputted into the extended compression code separator 54. In the extended compression code separator 54, the received extended compression code TD is separated into the compression code CC1C and the model parameters MP. The separated compression code CC1C is inputted into the wavelet compression decoder 55 corresponding to one of the compression code decoding units 36A and 36B so that the time series data D30A corresponding to the first data D30 is produced to be outputted, and in addition to this, the time series data D30A are transmitted to the time series model base estimating unit (estimator) 56.

On the other hand, the separated model parameters MP are outputted to the time series model base estimating unit 56.

In the time series model base estimating unit 56, the model parameters MP are inputted so the time series data D30A are processed by a filter specified by the model parameters MP so that the time series data D31A corresponding the second data D31 are indirectly generated.

Incidentally, the functions 51~53 are executed as the functions of the computer 10. Moreover, the functions 54~56 are also executed as the functions thereof.

Thus, in the fourth embodiment, the number of model parameters of the control mode (time series model) is extremely smaller than that of the time series data themselves, and therefore, in the case where the correlation is precise in advance as the time series model between a plurality of data each of which is collected from the object unit OU, and in the case where the plurality of data are compressed and transmitted, and are decompressed, it is possible to realize a high compression ratio by using the compression code encoding unit 21C and the compression code decoding unit 36C, and it is possible to obtain such an effect that the control model required for the design of the control system and evaluation thereof can be identified.

(Fifth Embodiment)

The fifth embodiment of the present invention will be described by referring to FIG. 19.

The fifth embodiment makes it impossible to easily expand (decompress) and decode the compression code even if the compression code is illegally tapped, by table-encoding the information of the actually used mother wavelet function and by embedding the code in the compression code as a transform code (index number), in the wavelet transform in the compression-encoding of the time series data described in the third embodiment or the fourth embodiment.

Figure 19:
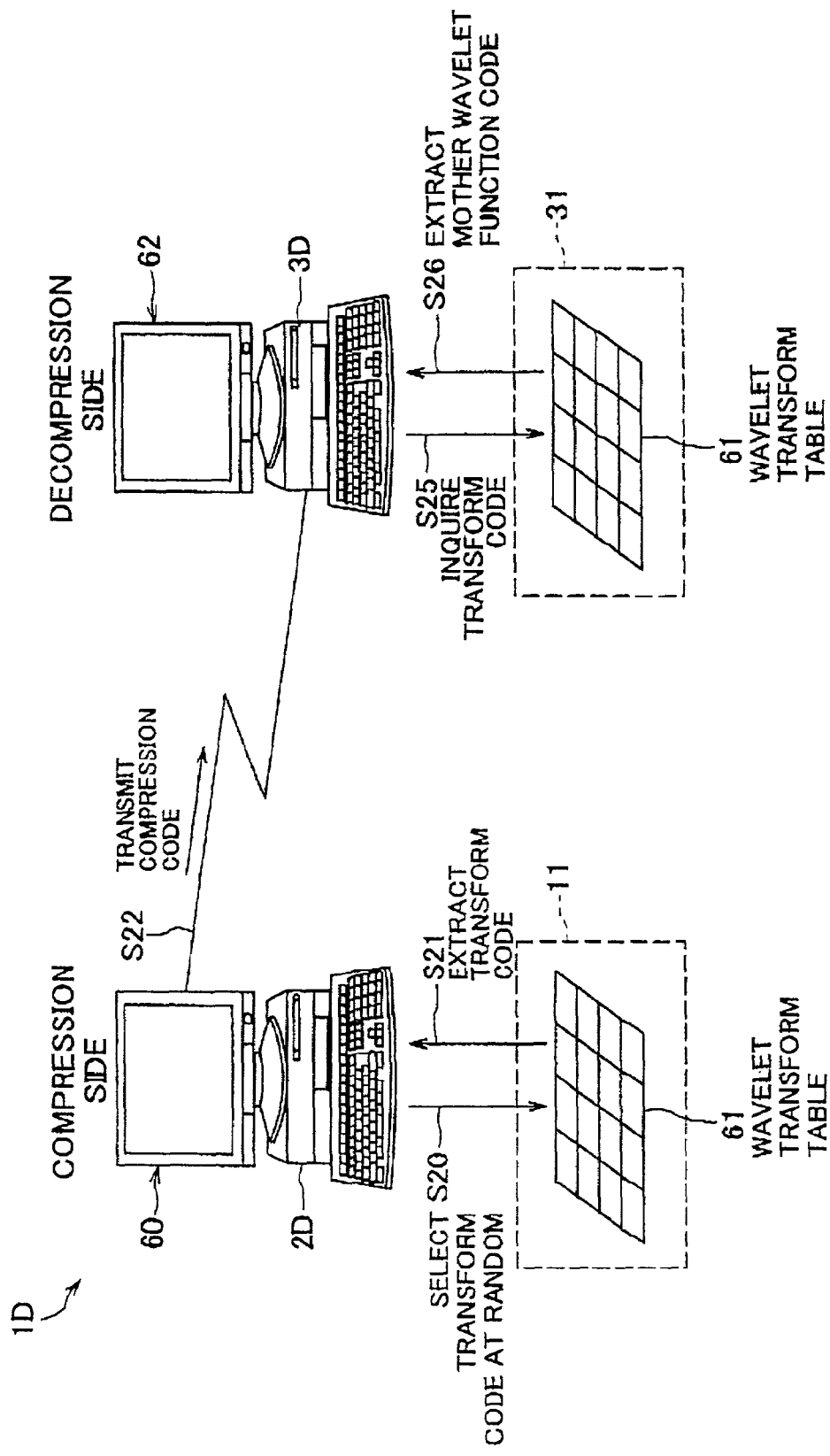
FIG. 19 is an explanatory view of a supervisory control system for keeping a data security of a compression code to be transmitted, according to a fifth embodiment of the present invention.

First, as shown in FIG. 19, in the supervisory control unit 2D on the compression side 60, the compression code encoding unit 21D of the supervisory control unit 2D selects, at random, one of the transform codes in the wavelet code transform table 61 stored on the memory 11 and including a plurality of codes corresponding to the mother wavelet function codes (Step S20), so as to extract the selected transform code from the wavelet code transform table 61 (Step S21). Incidentally, the wavelet code transform table 61 is stored on the memory 31 of the supervisory control center 3D of the decompression side 62.

The compression code encoding unit 21D of the supervisory control unit 2D generates a compression code of the compression code format by the transform code instead of the original mother wavelet function code shown in FIG. 13 and FIG. 15. The supervisory control unit 2D transmits the compression code by using the compression code format generated thereon (step S22).

In the supervisory control center 3D on the decompression side 62, the compression code decoding unit 36D, first, reads out the transform code from the compression code formats of the received compression code so as to inquire the readout transform code RC in the wavelet code transform table 61 (Step S25).

Then, from the wavelet code transform table 61, the compression code decoding unit 36D of the supervisory control center 3D extracts the original mother wavelet function code shown in FIGS. 13 or FIG. 15 (Step S26) so as to perform the decompression process by using the extracted original mother wavelet function code.

According to this structure, even if the compression code is tapped, the decompression (expansion) of the compression code is difficult, making it possible to ensure the security of the data communicated between the compression side 60 and the decompression side 62.

(Sixth Embodiment)

The sixth embodiment of the present invention will be described by referring to FIGS. 20~22.

The sixth embodiment manages the information corresponding to the wavelet code transform table 61 in the fifth embodiment by the code server 70, and the providing of the wavelet function information necessary in the compression and decompression at the time of transmission and reception by the processing of the code issue and code inquiry, and further improve the data security.

Figure 20:
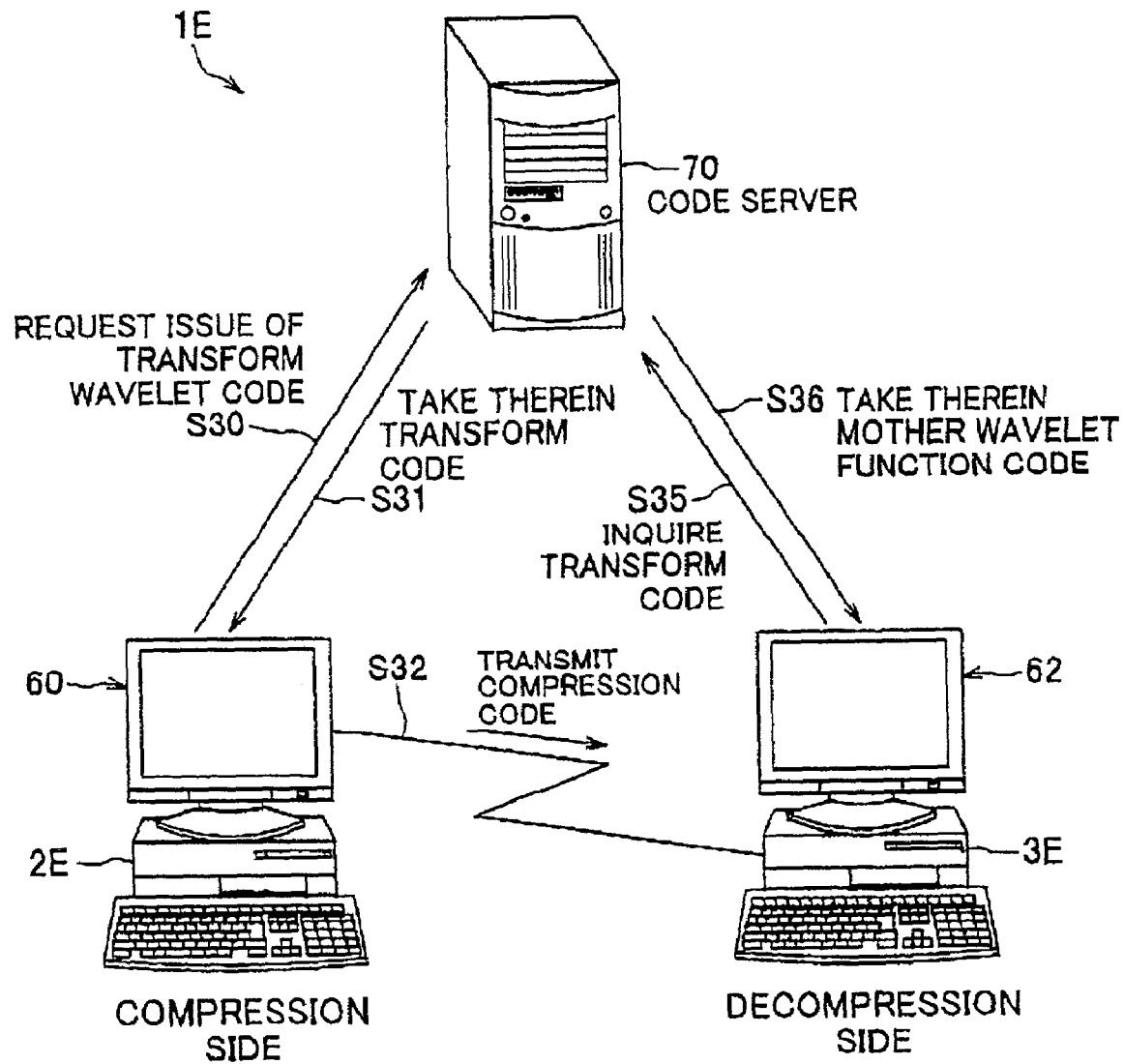
FIG. 20 is a view of a supervisory control system for keeping a data security of a compression code to be transmitted, according to a sixth embodiment of the present invention.

First, as shown in FIG. 20, in the supervisory control unit 2E on the compression side 60, the compression code encoding unit 21E of the supervisory control unit 2E requests an issue of the transform wavelet code to the code server 70 (Step S30). The code server 70 issues the transform code from the wavelet code transform table 61.

When the transform code is issued by the code server 70, the compression code encoding unit 21E takes therein the issued transform code (Step S31), so as to generate a compression code thereby transmitting the compression code to the supervisory control server 3D (Step S32).

In the supervisory control center 3E on the decompression side 62, the compression code decoding unit 36E reads out the transform code from the received compression code so as to inquire, by using the transform code, of the code server 70 about the mother wavelet function code corresponding to the transform code (Step S35). When the mother wavelet function code corresponding to the transform code is extracted by the code server 70, the compression code decoding unit 36E takes therein the extracted mother wavelet function (step 536), so as to perform the decompression process by using the taken mother wavelet function code.

According to the structure of the sixth embodiment, it is possible not only to improve the security of the supervisory control system realizing the centralized management of the wavelet code transform table 61, but also to easily perform the processing of the updating, change and the like of the wavelet code transform table.

(Seventh Embodiment)

The seventh embodiment of the present invention will be described by referring to FIG. 21.

The seventh embodiment constitutes a practical remote monitoring system whose supervisory delay is small, by combining the slicing of the data group with a time width and the compression-encoding and transmission.

Figure 21A:
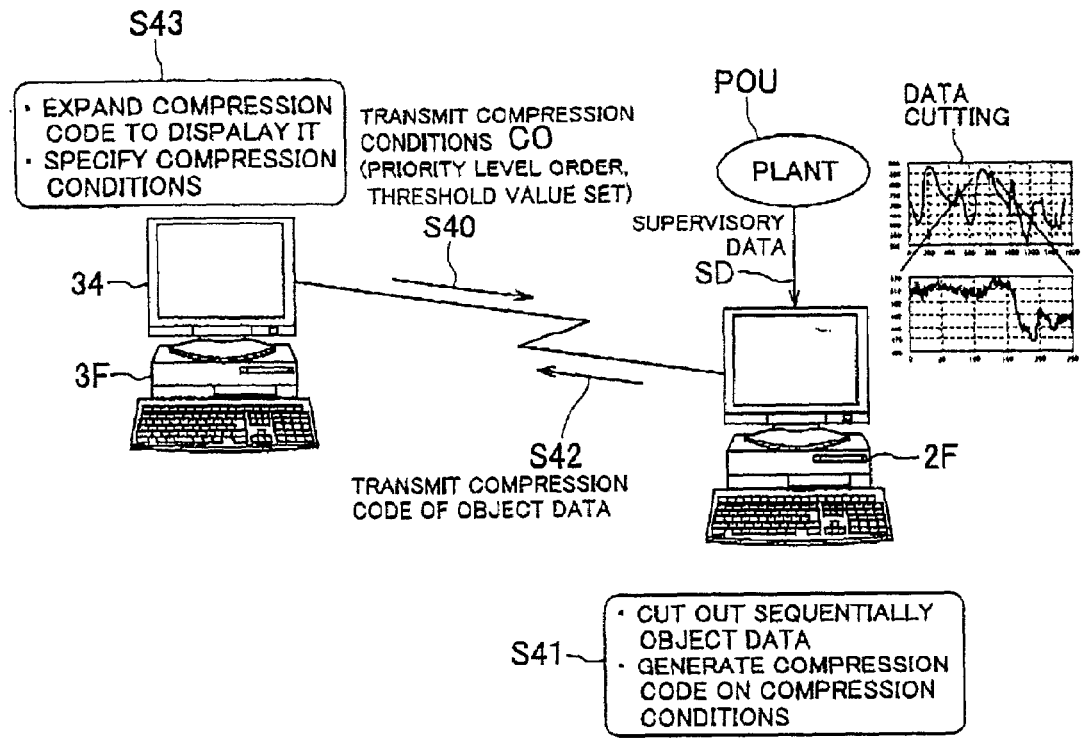
FIG. 21A is a view showing a supervisory control system according to a seventh embodiment of the present invention.

In FIG. 21A, a supervisory data SD is taken in the supervisory control unit 2F from the plant (object unit) POU, and, on the other hand, the supervisory control center 3E transmits the compression conditions (priority level order, threshold value set and so on) CO to the supervisory control unit 2F (Step S40).

The compression code encoding unit 21F, according to the transmitted compression conditions, periodically cuts out the object data for supervisory control from the supervisory data SD so as to generate a compression code on the basis of the compression conditions (Step S41).

The compression code encoding unit 21F transmits the generated compression code to the remote supervisory control center 3F (Step S42).

Figure 21B:
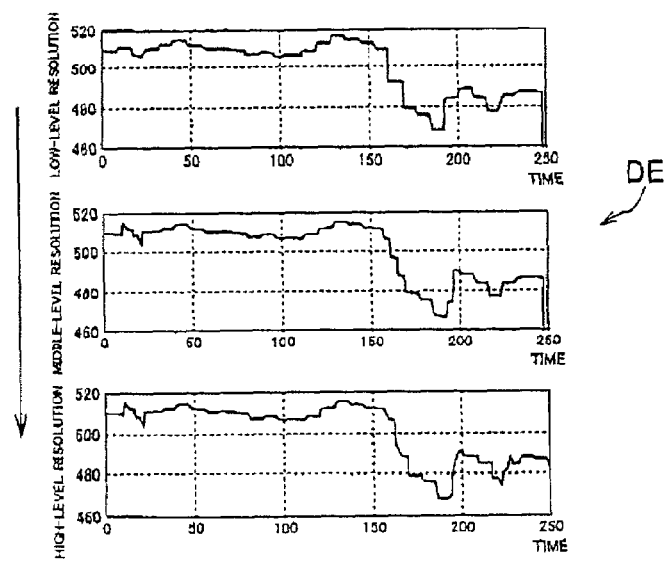
FIG. 21B is a view showing a display example on a supervisory monitor of a remote supervisory control center shown in FIG. 21A.

The remote supervisory control center 3F performs the sequential decompression processing to the compression code, displays the decompressed data on the supervisory monitor 34 and specifies the above compression conditions (Step 543). That is, on the supervisory monitor 34 of the remote supervisory control center 3F, the supervisory data of the plant POU of the time series data corresponding to the compression conditions is displayed like a display example DE as shown in FIG. 21B.

In this display example DE, the data is sequentially extended and displayed from the data with a low resolution to the time series data with a high resolution as shown by the upper step to the lower step (as shown by the arrow in the figure).

Thus, in the supervisory control unit 2F at the site, the data which is the object for supervisory control is cut out regularly (periodically), and on the basis of the compression conditions (priority level order, threshold value set or the like) specified from the remote supervisory control center 3F of the remote side, the cut-out supervisory data is sequentially compression-encoded to generate the compression code so as to be transmitted to the remote supervisory control center 3F.

In addition, on the remote supervisory control center 3F, the received compression code is also sequentially extended to be displayed on the monitor 34, and consequently, it is possible to constitute a monitoring system in which the resolution of the supervisory data can flexibly be controlled.

(Eighth Embodiment)

The eighth embodiment of the present invention will be described by referring to FIGS. 22~24.

The eighth embodiment constructs a supervisory control system such that the supervisory information is sequentially updated on the basis of the rate of the signal change, by performing the compression-encoding and transmission preferentially from the local peak maximum value of a level corresponding to the low frequency component, then performing the sub band decomposition by the wavelet transform.

Figure 22:
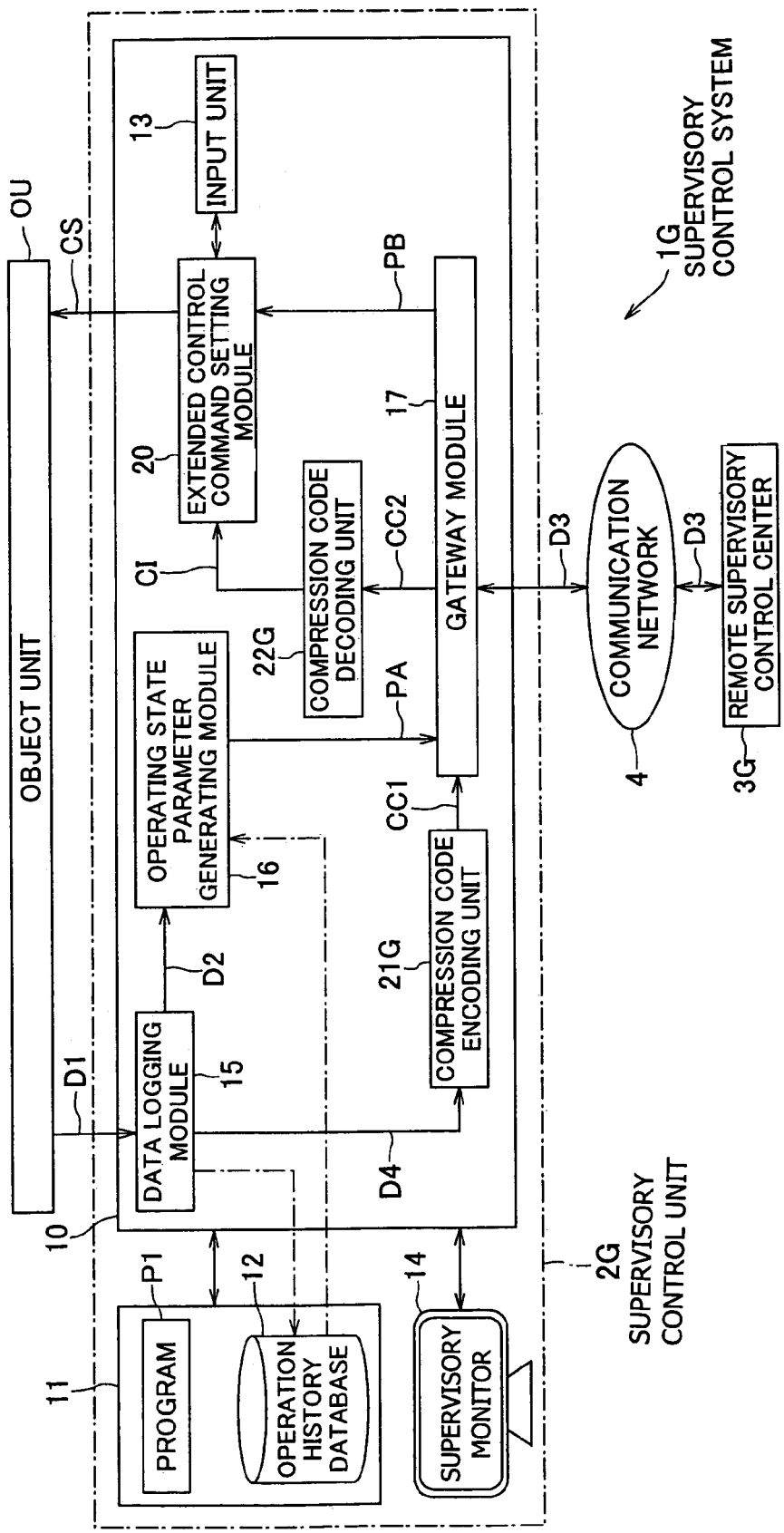
FIG. 22 is a functional block diagram of a supervisory control system according to an eighth embodiment of the present invention.
Figure 23:
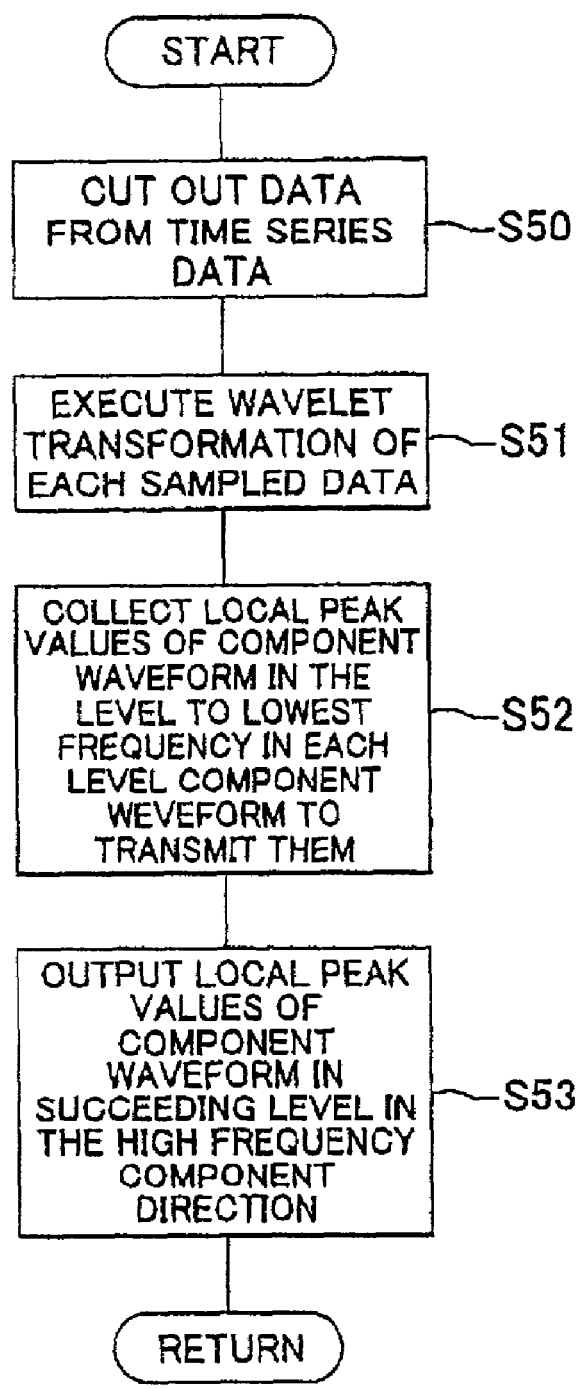
FIG. 23 is a flow chart schematically showing processes of a compression code encoding unit of the supervisory control system according to the eighth embodiment.

FIG. 22 is a functional block diagram of a supervisory control system according to the eighth embodiment of the present invention.

In the supervisory control system 1G according to the eighth embodiment, the compression code encoding unit 21G, the compression code decoding unit 22G, the compression code encoding unit 21G and the compression decoding unit 22G are different from those of the supervisory control system 1 of the first embodiment.

That is, the compression code encoding unit 21G sequentially cuts out data from a lot of time series data (process data groups) subjected to onsite supervision on the remote site for each proper time width (Step S50) and executes the wavelet transform of each of the cut out so as to decompose each of the cut out data to each given level (step S51).

Then, the compression code encoding unit 21G collects the local peak values of component waveform in the level corresponding to the lowest frequency so as to transmit the collected local peak maximum values as a bundle of compression codes (Step S52).

Furthermore, the compression code encoding unit 21G sequentially outputs local peak values of component waveform in succeeding level in the high frequency direction as each compression code (Step S53).

That is, the compression code encoding unit 21G assembles the local peak values of the respective component waveforms of the respective levels of the respective transform coefficients in their respective frequencies so as to generate compression codes on the basis of the respective assembled local peak values. The compression codes correspondingly includes the respective assembled local peak values. Moreover, the compression code encoding unit 21G sequentially transmits the compression codes, starting from one of the compression codes corresponding to the lowest frequency up to one of the compression codes corresponding to the highest frequency.

This processing procedure executed by the compression code encoding unit 21G is performed for each cut-out data, and on the other hand, at the remote supervisory control center 3G receiving these compression codes, the compression code of each level is sequentially reconstructed and displayed on the supervisory monitor 34.

Then, FIG. 24A is a view showing a time series data WE with a low-level resolution corresponding to the lowest frequency according to the eighth embodiment, FIG. 24B is a view showing a time series data with a middle-level resolution in the high frequency direction from the time series data shown in FIG. 24A according to the eighth embodiment and FIG. 24C is a view showing a time series data with a maximum-level resolution in the highest frequency direction from the time series data shown in FIG. 24B according to the eighth embodiment.

Consequently, in this embodiment, it is possible to rapidly grasp the outline of the response of the process data group that is the supervisory object, making it possible to update the detailed state of the response with the elapse of time.

(Ninth Embodiment)

The ninth embodiment of the present invention will be described by referring to FIGS. 25~26.

The ninth embodiment constructs a supervisory control system such that the supervisory information is updated on the basis of the magnitude of the signal change, by preparing a plurality of threshold values when selecting the local peak maximum value to be compression-encoded, and by preferentially sequentially selecting and encoding and transmitting the peak from ones satisfying the tight threshold condition (large threshold value) to ones satisfying a loose threshold condition (small threshold value) additionally.

Figure 25:
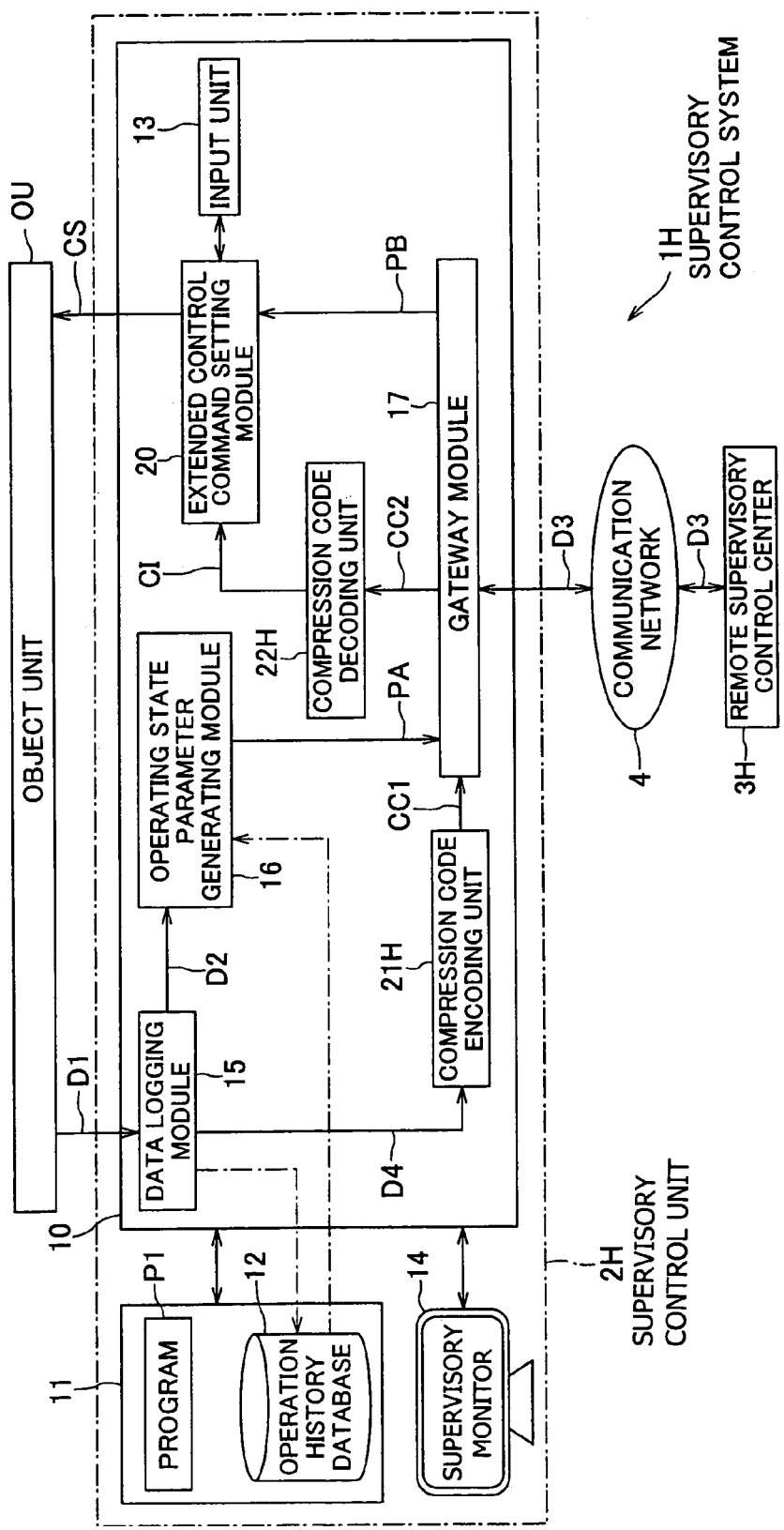
FIG. 25 is a functional block diagram of a supervisory control system according to an eighth embodiment of the present invention.

FIG. 25 is a functional block diagram of a supervisory control system according to the ninth embodiment of the present invention.

In the supervisory control system 1H according to the eighth embodiment, the compression code encoding unit 21H, the compression code decoding unit 22H, the compression code encoding unit 21 and the compression code decoding unit 22H are different from those of the supervisory control system 1 of the first embodiment.

That is, after the processes in Steps S50 and S51, the compression code encoding unit 21H collects the local peak maximum values of each level component waveform having an absolute value larger than the maximum threshold value in a plurality of set threshold value levels so as to transmit them as a bundle of compression codes.

Next, when the threshold value level is sequentially lowered, the local peak maximum values of each level that have not been encoded at the previous threshold value levels are added, and encoded and transmitted.

That is, the compression code encoding unit 21H assembles the local peak values of the respective transform coefficients by using one of the threshold values which is sequentially selected in threshold values in descending order so that each of absolute values of each of the assembled groups of local peak values is larger than each of the selected one of the threshold values so as to generate compression codes on the basis of the respective assembled groups of the local peak values. The compression codes correspondingly includes the respective assembled local peak values. The compression code encoding unit 21H sequentially transmits the compression codes, starting from one of the compression codes corresponding to the largest threshold value up to one of the compression codes corresponding to the lowest threshold value.

This processing procedure executed by the compression code encoding unit 21H is performed for each data collecting.

On the other hand, in the remote supervisory control center 3H receiving these compression codes, the compression codes of each level are sequentially reconstructed, and displayed on the supervisory monitor 34 as a process data group.

Then, FIG. 26 is a view showing a change of the supervisory signal observed on the remote supervisory control center side in a case where the compression efficiency is controlled by sequentially decreasing the threshold value from a large value, according to the ninth embodiment.

Figure 26A:
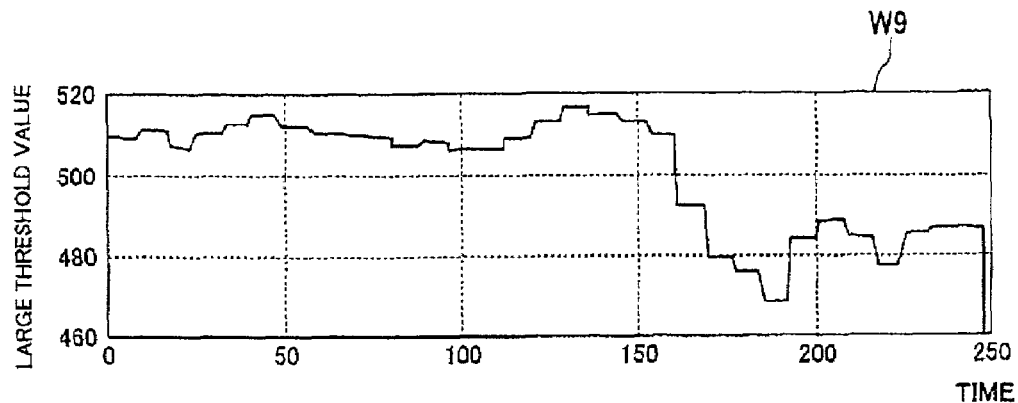
FIG. 26 is a view showing a change of a supervisory signal observed on a remote supervisory control center side in a case where a compression efficiency is controlled by sequentially decreasing a threshold value from a large value, according to a ninth embodiment of the present invention.
Figure 26B:
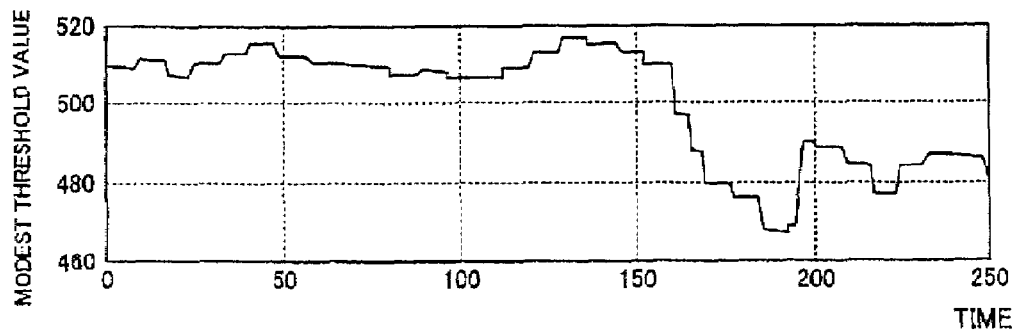
Figure 26C:
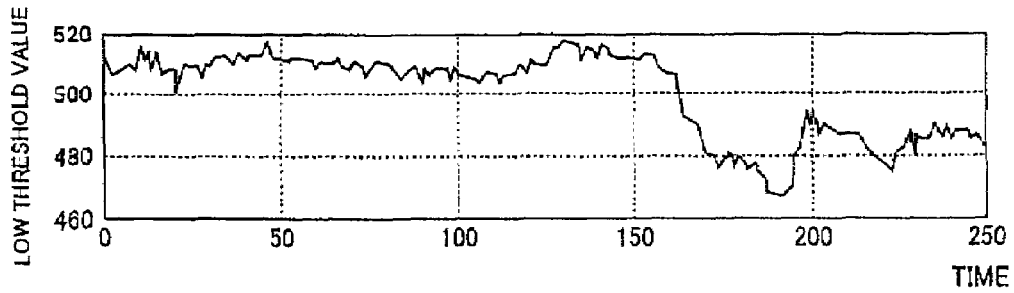

The magnitude of the threshold value is decreased in the order of "threshold value, large" shown in FIG. 26A, "threshold value, modest" shown in FIG. 26B, and "threshold value, small" shown in FIG. 26C. Accordingly, the detailed state Is sequentially reproduced.

Consequently, in this embodiment, it is possible to quickly grasp the outline of the response of the process data group that is the supervisory object, making it possible to update the detailed state of the response with the elapse of time.

Herein, as the tenth embodiment, it is possible to combine and practice the eighth embodiment and the ninth embodiment.

Concretely, as selecting means of the local peak maximum values to be encoded as compression codes, means is adopted, in which there are properly mixed two means of the level selection corresponding to the frequency shown in the eighth embodiment, and of the comparison selection to the absolute value of the peak maximum value with a plurality of threshold values shown in the ninth embodiment. According to this means, it is possible to configure a remote monitoring system in which a suitable combination priority order is considered in the magnitude and the rate of the change to be seriously taken, in the remote supervision of the object system.

(Eleventh Embodiment)

Figure 27:
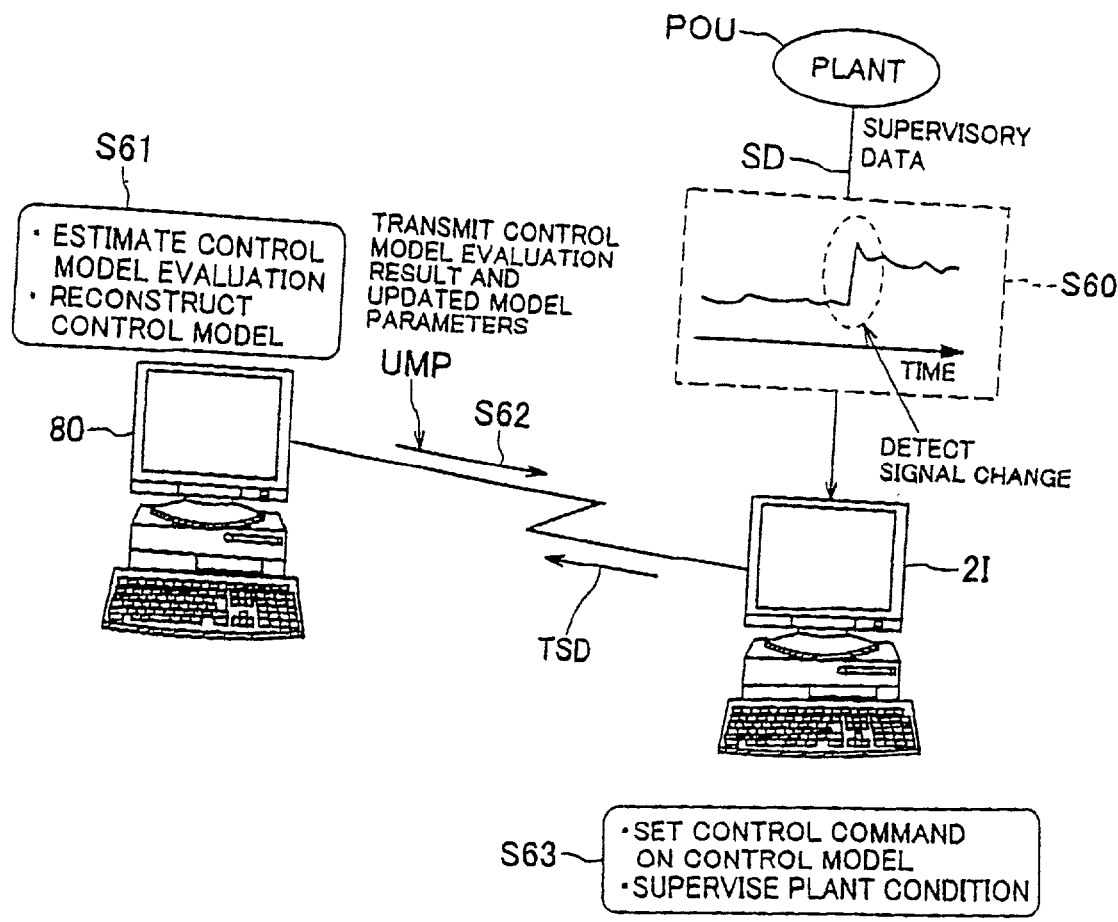
FIG. 27 is a view of a supervisory control system according to a tenth embodiment of the present invention.

The eleventh embodiment of the present invention will be described by referring to FIG. 27.

The eleventh embodiment gives attention to the fact that it is best to utilize the data of the case where a step-like change is generated, when continuously verifying the validity of the model that is the basis of the control system design in the remote supervisory control, and it detects the timing of the evaluation of the model validity by supervising the step-like change, and performs the automatic model updating.

First, supervisory data SD is taken in from the plant POU and when a signal change as, for example, the step-like change is detected (Step S60), the compression code encoding unit 21I of the supervisory control unit 21 compresses the time series data before and after the detected timing of the change of the signal so as to produce the compression code, thereby transmitting transmit the compression code corresponding to the time series data TSD before and after the change to a remote model management unit 80 having same functions of the remote supervisory control system 3.

On the remote model management unit 80 side, the transmitted compression code as the received time series data TSD is extended by using the inverse wavelet transform, and on the basis of the obtained time series data, the validity of the control model is checked and, if necessary, the reconstruction of the control model is performed (Step S61).

The processing result of this remote model management unit 80 is transmitted to the supervisory control unit 21 as an updated model parameter UMP of the model evaluation result (Step S62). The supervisory control unit 2I, on the basis of the updated model parameter UMP, sets a control command based on the control model so as to perform the reconstruction of the control (Step S63).

Thus, when a useful signal change of the object data is detected, the time series data before and after the change are compression-encoded in the supervisory control unit at the site, and it is transmitted to the remote side. On the remote side, the validity of the control model is evaluated on the basis of the time series data obtained by extending the received compression code, and if necessary, the reconstruction of the control model is performed, and the updating of the control model at the site is performed by returning the model parameter to the site. The above-described function can easily and automatically be operated since a useful signal change can automatically be detected.

Incidentally, in this embodiment, while the signal change is not detected, the compression code encoding unit 2I may not compress the time series data so that the compression code is not transmitted to the remote supervisory control system 3, or the compression coda may compress the time series data so as to transmit only the smoothed signal thereto.

As a result, because the time series data, as remote supervisory control, about which the supervisor has a little or no concern are not transmitted to the remote supervisory control system 3, or a part of which is transmitted thereto, it is possible to decrease the transmission amount of the time series data to the remote supervisory control system 3, making it possible to improve the efficient of the remotely supervisory control of the time series data.

Incidentally, typical embodiments of the present invention have been described above, but the contents concretely described in the embodiments can take various embodiments by the partial change of the system configuration and the procedure or the like, and the present invention covers the basic technical contents necessary when expanding the remote service using the time series data.

While there has been described what is at present considered to be the preferred embodiments and modifications of the present invention. It will be understood that various modifications which are not described yet may be made therein, and it is intended to cover in the appended claims all such modifications as fall within the true spirit and scope of the invention.

The entire contents of Japanese Patent Application H11-350388, filed Dec. 9, 1999, is incorporated herein by reference.

What is claimed is:

1. A data compression system for compressing original time series data with a various waveform, comprising:
   a compression unit configured to generate a compression code by compressing the original time series data without damaging characteristics of waveform information in the various waveform, the waveform information including a signal with a various change including one of a step-like signal change and a local signal average value;
a transmitting unit configured to transmit the compression code through a network; and
a decompression unit being intercommunicated through the network with the transmitting unit;
wherein said compression unit is configured to perform a wavelet transform to the original time series data by using a mother wavelet function to decompose the original time series data into a predetermined level number of component waveforms, each of the waveforms of each level having local peak value data, to extract at least one of the local peak value data of each of the component waveforms, to refer to a mother wavelet code transform table by using a mother wavelet function code corresponding to the mother wavelet function to extract a transform code,
wherein the compression code includes the extracted local peak value data, one of the component waveforms having a low frequency of a final level, the transform code, and a number of decomposition levels, and
the extracted local peak value data includes a peak value which is not less than a predetermined threshold value thereof and a position in a data-frame of each level thereof;
said decompression unit comprising:
a receiving unit configured to receive the transmitted compression code; and
an inverse wavelet transform unit configured to perform an inverse wavelet transform to the compression code to reconstruct time series data having the characteristics of the waveform information of the original time series data, said inverse wavelet transform unit stores thereon the mother wavelet code table, refers the mother wavelet code table by using the transform code of the compression code to extract the mother wavelet function code and decompresses the compression code by using the mother wavelet function code.

2. The data compression system according to claim 1, wherein said decompression unit is configured to transmit compression conditions for each cutting out of the original time series data to the compression unit through the network based on a supervisory result of the reconstructed time series data based on the original time series data, said compression unit is configured to generate the compression code according to the compression conditions, and wherein said decompression unit sequentially decompresses the transmitted compression code to display thereon the decompressed data.

3. The data compression system according to claim 1, wherein said compression unit, for each cutting out of the original time series data, is configured to assemble the local peak values of the respective component waveforms of the respective levels of in their respective frequencies so as to generate compression codes based on the respective assembled local peak values, said compression codes correspondingly including the respective assembled local peak values, and sequentially generates one of the compression codes and transmits the generated one of the compression codes, starting from one of the compression codes corresponding to the lowest frequency up to one of the compression codes corresponding to the highest frequency, and wherein said decompression unit receives the sequentially transmitted compression codes to reconstruct each of the compression codes, thereby sequentially displaying the reconstructed compression codes.

4. The data compression system according to claim 1, wherein said compression unit, for each cutting out of the original time series data, is configured to assemble the local peak values of the respective transform coefficients by using one of the threshold values which is sequentially selected in threshold values in descending order so that each of absolute values of each of the assembled groups of local peak values is larger than each of the selected one of the threshold values to generate compression codes based on the respective assembled groups of the local peak values, said compression codes correspondingly including the respective assembled local peak values, and sequentially generates one of the compression codes and transmits the generated one of the compression codes, starting from one of the compression codes corresponding to the largest threshold value up to one of the compression codes corresponding to the lowest threshold value, and wherein said decompression unit is configured to receive the sequentially transmitted compression codes to reconstruct each of the compression codes, thereby sequentially displaying the reconstructed compression codes.

5. The data compression system according to claim 1, wherein said compression unit comprises:
a first means, for each cutting out of the original time series data, for assembling the local peak values of the respective component waveforms of the respective levels in their respective frequencies so as to generate compression codes based on the respective assembled local peak values, said compression codes correspondingly including the respective assembled local peak values, and sequentially generates one of the compression codes and transmits the generated one of the compression codes, starting from one of the compression codes corresponding to the lowest frequency up to one of the compression codes corresponding to the highest frequency; and
a second means, for each cutting out of the original time series data, for assembling the local peak values of the respective transform coefficients by using one of the threshold values which is sequentially selected in threshold values in descending order so that each of absolute values of each of the assembled groups of local peak values is larger than each of the selected one of the threshold values to generate compression codes based on the respective assembled groups of the local peak values, said compression codes correspondingly including the respective assembled local peak values, and sequentially generates one of the compression codes and transmits the generated one of the compression codes, starting from one of the compression codes corresponding to the largest threshold value up to one of the compression codes corresponding to the lowest threshold value, and
wherein said decompression unit is configured to receive the sequentially transmitted compression codes so as to reconstruct each of the compression codes, thereby sequentially displaying the reconstructed compression codes.

6. The data compression system according to claim 5, when detecting a signal change as for the original time series data on the basis of each waveform component of each level of the original time series data, wherein said compression unit generates the compression codes by using one of the first and second means to transmit the generated compression codes, said decompression unit receives each of the compression codes to reconstruct each of the compression codes of each decomposition level thereby sequentially displaying the reconstructed compression codes, and evaluate, on the basis of the reconstructed time series data, validity of a control model to transmit the evaluated result to the compression unit, if necessary, reconstruct the control model and transmit the model parameter to the compression unit, and wherein said compression unit update the control model to improve control performance thereof.

7. The data compression system according to claim 1, wherein said one of the component waveforms having the low frequency of the final level is one of a smoothed signal value and an average value of the original time series data.

8. The data compression system according to claim 1, further comprising:
a modeling unit configured to generate a model parameter based on the control model identifying the correlation of input and output; and
an extended compression code generating unit configured to generate an extended compression code based on the first compression code and the model parameter.

9. The data compression system according to claim 1, wherein said original time series data includes a first time series data and a second time series data, the first and second time series data having a correlation of input and output as a control model with each other, the first time series data corresponding to the input, the second time series data corresponding to the output;
said compression unit is configured to generate a first compression code by compressing the first time series data; and
said transmitting unit is configured to transmit the extended compression code through the network.

10. The data compression system according to claim 9, further comprising a decompression unit being intercommunicated through the network with the transmitting unit, the decompression unit comprising:
a receiving unit configured to receive the transmitted extended compression code;
a separator unit configured to separate the transmitted extended compression code into the first compression code and the model parameter;
an inverse wavelet transform unit configured to perform an inverse wavelet transform to the first compression code to reconstruct the first time series data; and
a reconstruction unit configured to reconstruct the second time series data based on the reconstructed first time series data and the model parameter.

11. A data compression system for compressing original time series data with a various waveform, comprising:
a compression unit configured to generate a compression code by compressing the original time series data without damaging characteristics of a waveform information in the various waveform, the waveform information including a signal with a various change including one of a step-like signal change and a local signal average value;
a transmitting unit configured to transmit the compression code through a network;
a decompression unit being intercommunicated through the network with the transmitting unit; and
a storing unit storing thereon a mother wavelet code table, wherein said compression unit is configured to perform a wavelet transform to the original time series data by using a mother wavelet function to decompose the original time series data into a predetermined level number of component waveforms, each of the waveforms of each level having local peak value data, to extract at least one of the local peak value data of each of the component waveforms, to inquire a transform code of the storing unit by using a mother wavelet function code corresponding to the mother wavelet function to extract the transform code issued by the storing unit based on the mother wavelet code transform table,
wherein the compression code includes the extracted local peak value data, one of the component waveforms having a low frequency of a final level, the transform code, and a number of decomposition levels, and
the extracted local peak value data includes a peak value which is not less than a predetermined threshold value thereof and a position in a data-frame of each level thereof;
said decompression unit comprising:
a receiving unit configured to receive the transmitted compression code; and
an inverse wavelet transform unit configured to perform an inverse wavelet transform to the compression code to reconstruct time series data having the characteristics of the waveform information of the original time series data, said inverse wavelet transform unit inquires the mother wavelet function code of the storing unit by using the transform code to extract the mother wavelet function code issued by the storing unit on the basis of the mother wavelet code transform table, and decompresses the compression code by using the mother wavelet function code.

12. The data compression system according to claim 11, wherein said one of the component waveforms having the low frequency of the final level is one of a smoothed signal value and an average of the original time series data.

13. The data compression system according to claim 11, further comprising:
a modeling unit configured to generate a model parameter based on the control model identifying the correlation of input and output; and
an extended compression code generating unit configured to generate an extended compression code based on the first compression code and the model parameter.

14. The data compression system according to claim 11, wherein said original time series data includes first time series data and second time series data, the first and second time series data having a correlation of input and output as a control model with each other, the first time series data corresponding to the input, the second time series data corresponding to the output;
said compression unit is configured to generate a first compression code by compressing the first time series data;
the system further comprising an extended compression code generating unit configured to generate an extended compression code based on the first compression code and a model parameter corresponding to the control model; and
said transmitting unit is configured to transmit the extended compression code through the network.

15. The data compression system according to claim 14, wherein said receiving unit is configured to receive the transmitted extended compression code;
the system further comprising a separator unit configured to separate the transmitted extended compression code into the first compression code and the model parameter;

said inverse wavelet transform unit is configured to perform the inverse wavelet transform on the first compression code to reconstruct the first time series data; and a reconstruction unit is configured to reconstruct the second time series data based on the reconstructed first time series data and the model parameter.

16. The data compression system according to claim 11, wherein said decompression unit is configured to transmit compression conditions for each cutting out of the original time series data to the compression unit through the network based on a supervisory result of the reconstructed time series data based on the original time series data;

said compression unit is configured to generate the compression code according to the compression conditions; and wherein said decompression unit sequentially decompresses the transmitted compression code to display thereon the decompressed data.

17. The data compression system according to claim 11, wherein said compression unit, for each cutting out of the original time series data, is configured to assemble the local peak values of the respective component waveform of the respective levels of their respective frequencies so as to generate compression codes based on the respective assembled local peak values, said compression codes correspondingly including the respective assembled local peak values, and sequentially generates one of the compression codes and transmits the generated one of the compression codes, starting from one of the compression codes corresponding to the lowest frequency up to one of the compression codes corresponding to the highest frequency, and wherein said decompression unit receives the sequentially transmitted compression codes to reconstruct each of the compression codes, thereby sequentially displaying the reconstructed compression codes.

18. The data compression system according to claim 11, wherein said compression unit, for each cutting out of the original time series data, is configured to assemble the local peak values of the respective transform coefficients by using one of the threshold values which is sequentially selected in threshold values in descending order so that each of absolute values of each of the assembled groups of local peak values is larger than each of the selected one of the threshold values to generate compression codes based on the respective assembled groups of the local peak values, said compression codes correspondingly including the respective assembled local peak values; and sequentially generates one of the compression codes and transmits generated one of the compression codes, starting from one of the compression codes corresponding to the largest threshold value up to one of the compression codes corresponding to the lowest threshold value; and wherein said decompression unit receives the sequentially transmitted compression codes to reconstruct each of the compression codes, thereby sequentially displaying the reconstructed compression codes.

19. The data compression system according to claim 11, wherein said compression unit comprises a first means, for each cutting out of the original time series data, for assembling the local peak values of the respective component waveforms of the respective levels of their respective frequencies so as to generate compression codes based on the respective assembled local peak values, said compression codes correspondingly including the respective assembled local peak values, and sequentially generates one of the compression codes and transmits a generated one of the compression codes, starting from one of the compression codes corresponding to the lowest frequency up to one of the compression codes corresponding to the highest frequency;

and a second means, for each cutting out of the original time series data, for assembling the local peak values of the respective transform coefficients by using one of the threshold values which is sequentially selected in threshold values in descending order so that each of absolute values of each of the assembled groups of local peak values is larger than each of the selected one of the threshold values to generate compression codes based on the respective assembled groups of the local peak values, said compression codes correspondingly including the respective assembled local peak values, and sequentially generates one of the compression codes and transmits a generated one of the compression codes, starting from one of the compression codes corresponding to the largest threshold value up to one of the compression codes corresponding to the lowest threshold value; and wherein said decompression unit receives the sequentially transmitted compression codes so as to reconstruct each of the compression codes, thereby sequentially displaying the reconstructed compression codes.

20. The data compression system according to claim 19, when detecting a signal change as for the original time series data on the basis of each waveform component of each level of the original time series data, wherein said compression unit generates the compression codes by using one of the first and second means to transmit the generated compression codes, said decompression unit receives each of the compression codes to reconstruct each of the compression codes of each decomposition level thereby sequentially displaying the reconstructed compression codes, and evaluates, based on the reconstructed time series data, validity of a control model to transmit the evaluated result to the compression unit, if necessary, to reconstruct the control model and transmit the model parameter to the compression unit; and wherein said compression unit is configured to update the control model to improve control performance thereof.

* * * * *